United States Patent
Hamatani et al.

(10) Patent No.: US 8,345,435 B2
(45) Date of Patent: Jan. 1, 2013

(54) TERMINAL STRUCTURE AND MANUFACTURING METHOD THEREOF, AND ELECTRONIC DEVICE AND MANUFACTURING METHOD THEREOF

(75) Inventors: Toshiji Hamatani, Tochigi (JP); Hiroki Adachi, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 181 days.

(21) Appl. No.: 12/851,274

(22) Filed: Aug. 5, 2010

(65) Prior Publication Data

US 2011/0032684 A1    Feb. 10, 2011

(30) Foreign Application Priority Data

Aug. 7, 2009  (JP) .................................. 2009-185092

(51) Int. Cl.
*H05K 1/03*    (2006.01)
*H05K 1/16*    (2006.01)
*H01L 23/48*  (2006.01)

(52) U.S. Cl. ........ 361/762; 361/748; 361/749; 361/750; 361/751; 361/760; 174/250; 174/255; 174/256; 174/260; 438/118; 438/125; 438/127; 438/155; 438/455; 438/613; 257/678; 257/687; 257/734; 257/738; 257/E21.002; 257/E21.003; 257/E21.502

(58) Field of Classification Search .......... 361/760–768, 361/772–778, 792–798, 748–752; 257/676, 257/692, 734–739, 771–776, 766, E21.001, 257/E21.002, E21.508, E21.575, 780–782, 257/751; 174/250–267; 438/113–127, 612, 438/155, 455, 613–618; 29/825–852

See application file for complete search history.

(56) References Cited

U.S. PATENT DOCUMENTS

| | | | | |
|---|---|---|---|---|
| 6,054,171 A * | 4/2000 | Shoji | ............................ | 438/106 |
| 6,063,647 A * | 5/2000 | Chen et al. | ................... | 438/108 |
| 6,294,316 B1 * | 9/2001 | Kaneda et al. | ................ | 430/314 |
| 6,404,051 B1 * | 6/2002 | Ezawa et al. | ................... | 257/734 |
| 6,475,896 B1 * | 11/2002 | Hashimoto | ................... | 438/613 |
| 6,483,191 B2 * | 11/2002 | Umezaki | ....................... | 257/738 |
| 6,583,364 B1 * | 6/2003 | Kurita et al. | .................. | 174/254 |
| 6,643,923 B1 * | 11/2003 | Hishinuma et al. | ............. | 29/846 |
| 6,930,390 B2 * | 8/2005 | Kaneda et al. | ................ | 257/738 |
| 7,189,927 B2 * | 3/2007 | Sakuyama | .................... | 174/261 |

(Continued)

FOREIGN PATENT DOCUMENTS

JP  2002-290006    10/2002

(Continued)

*Primary Examiner* — Michail V Datskovskiy
(74) *Attorney, Agent, or Firm* — Nixon Peabody LLP; Jeffrey L. Costellia

(57) ABSTRACT

A conductor having a projecting portion is formed which forms a terminal portion. An uncured prepreg including a reinforcing material is closely attached to the conductor and the prepreg is cured to form an insulating film including the reinforcing material. When the prepreg is closely attached, the prepreg is stretched by the projecting portion, so that a region of the prepreg, which is closely attached to the conductor, can be thinner than the other region of the prepreg. Then, by reducing the thickness of the entire insulating film, an opening can be formed in the portion having a smaller thickness. The step of reducing the thickness can be performed by etching. Further, it is preferable not to remove the reinforcing material in this step. The strength of a terminal and an electronic device can be increased by leaving the reinforcing material at the opening.

15 Claims, 18 Drawing Sheets

U.S. PATENT DOCUMENTS

| | | | |
|---|---|---|---|
| 7,736,958 B2 * | 6/2010 | Dozen et al. | 438/155 |
| 7,785,933 B2 * | 8/2010 | Dozen et al. | 438/127 |
| 7,968,427 B2 * | 6/2011 | Sugiyama et al. | 438/455 |
| 7,969,003 B2 * | 6/2011 | Huang | 257/737 |
| 8,044,499 B2 * | 10/2011 | Chida et al. | 257/690 |
| 2001/0048160 A1 * | 12/2001 | Umezaki | 257/738 |
| 2006/0105153 A1 * | 5/2006 | Jang et al. | 428/209 |
| 2008/0012117 A1 * | 1/2008 | Kim | 257/693 |
| 2008/0224940 A1 * | 9/2008 | Sugiyama et al. | 343/873 |
| 2008/0224941 A1 | 9/2008 | Sugiyama et al. | |
| 2008/0236869 A1 * | 10/2008 | Marte et al. | 174/125.1 |
| 2008/0242005 A1 * | 10/2008 | Dozen et al. | 438/127 |
| 2008/0303140 A1 * | 12/2008 | Ohtani et al. | 257/729 |
| 2009/0302457 A1 | 12/2009 | Chida et al. | |

FOREIGN PATENT DOCUMENTS

| | | |
|---|---|---|
| JP | 2007-091822 | 4/2007 |
| JP | 2008-257710 | 10/2008 |
| JP | 2008-262547 | 10/2008 |

* cited by examiner

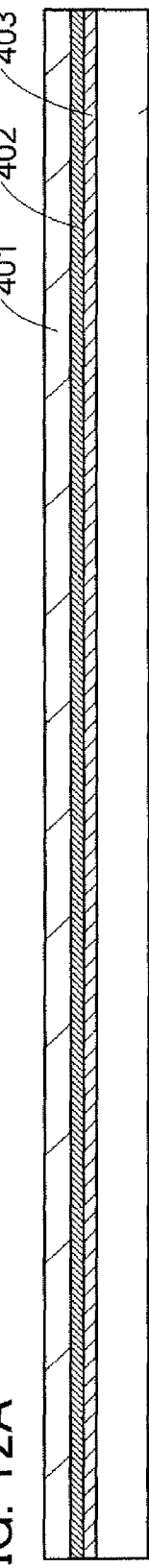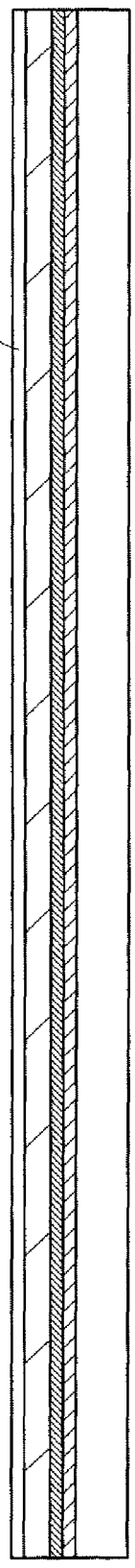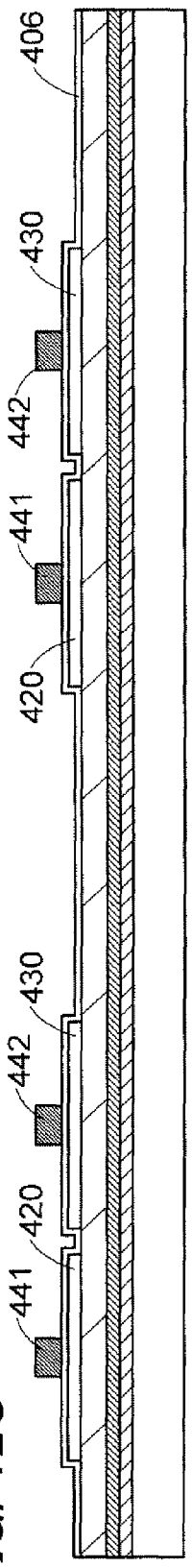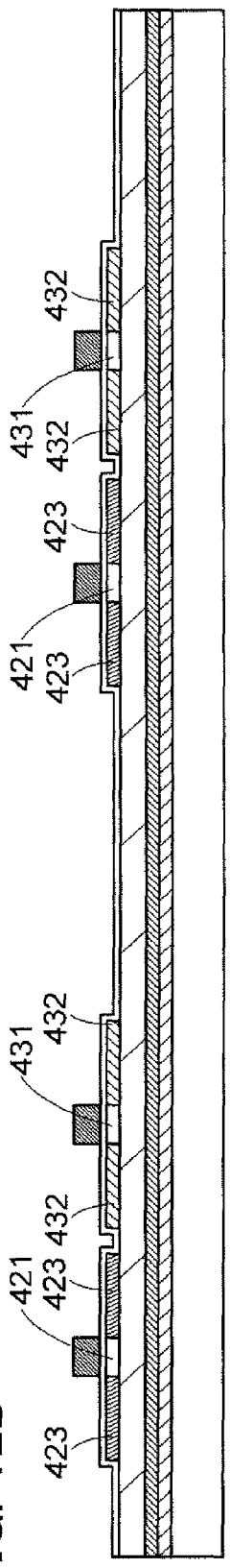
FIG. 12A
FIG. 12B
FIG. 12C
FIG. 12D

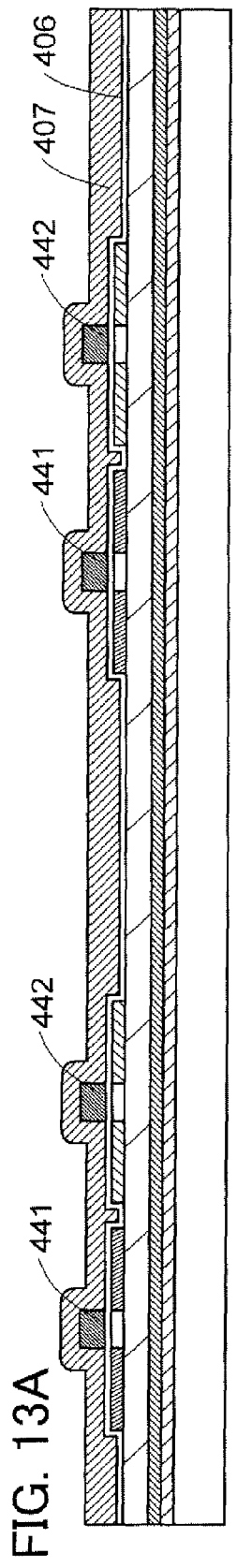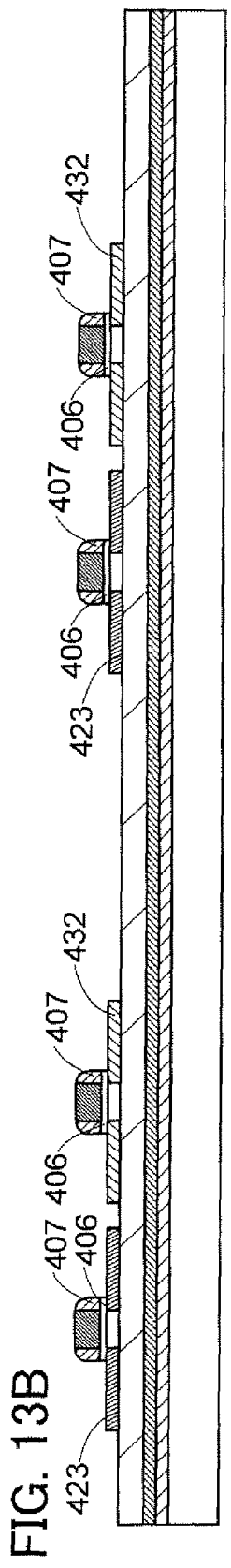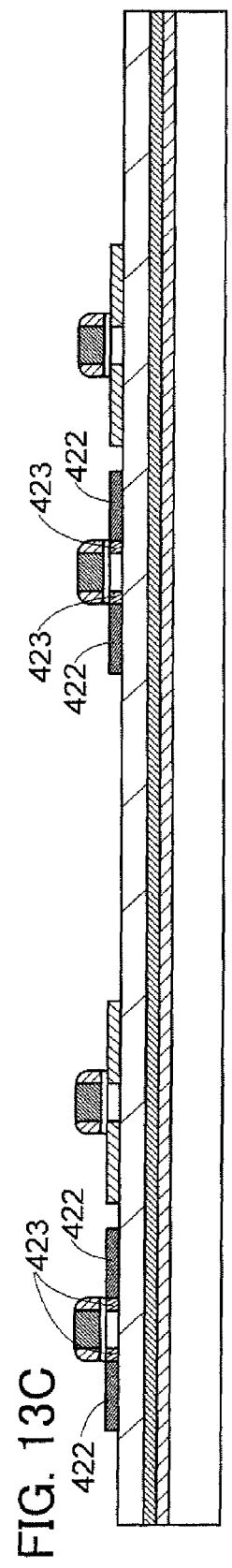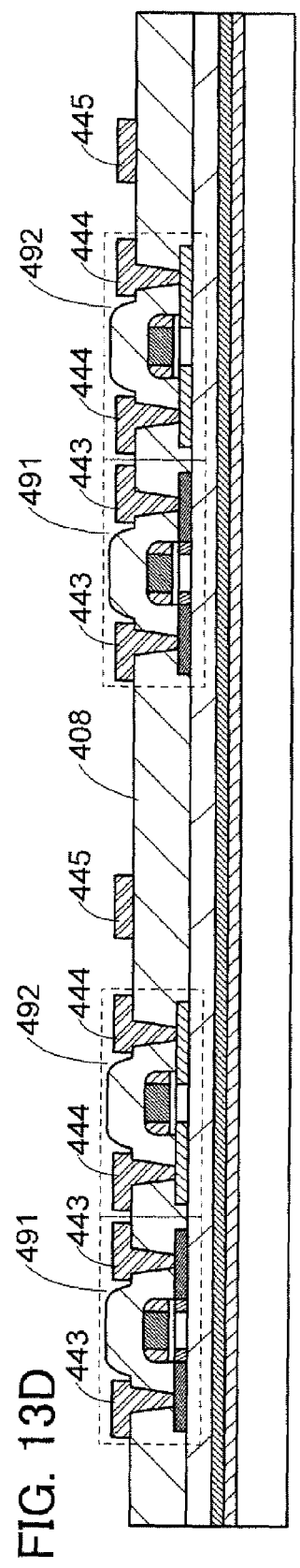

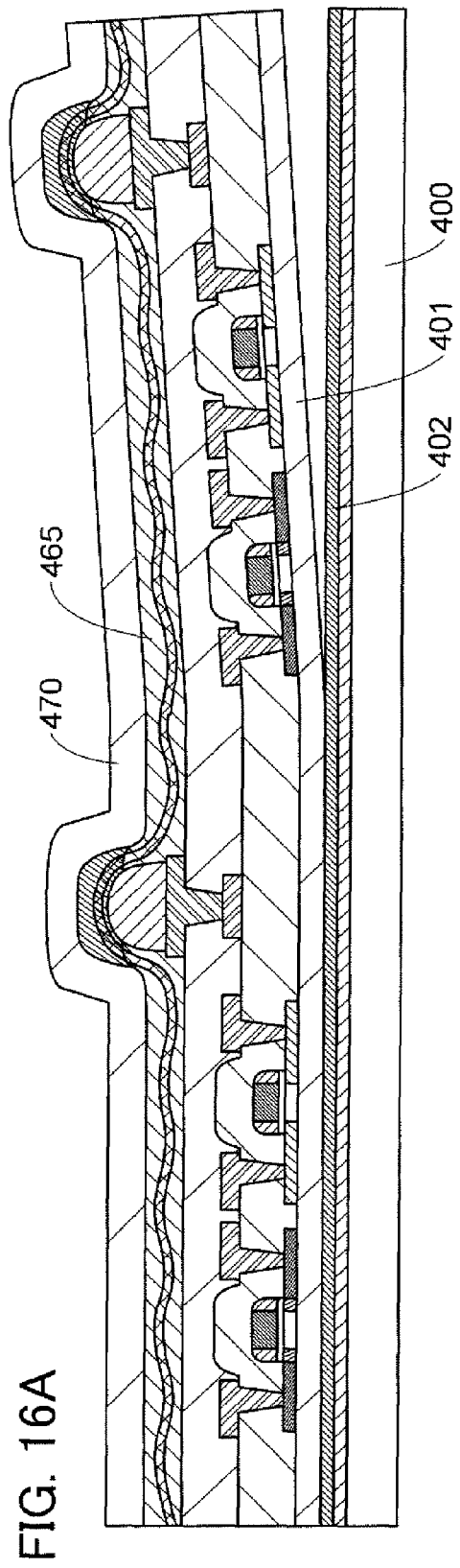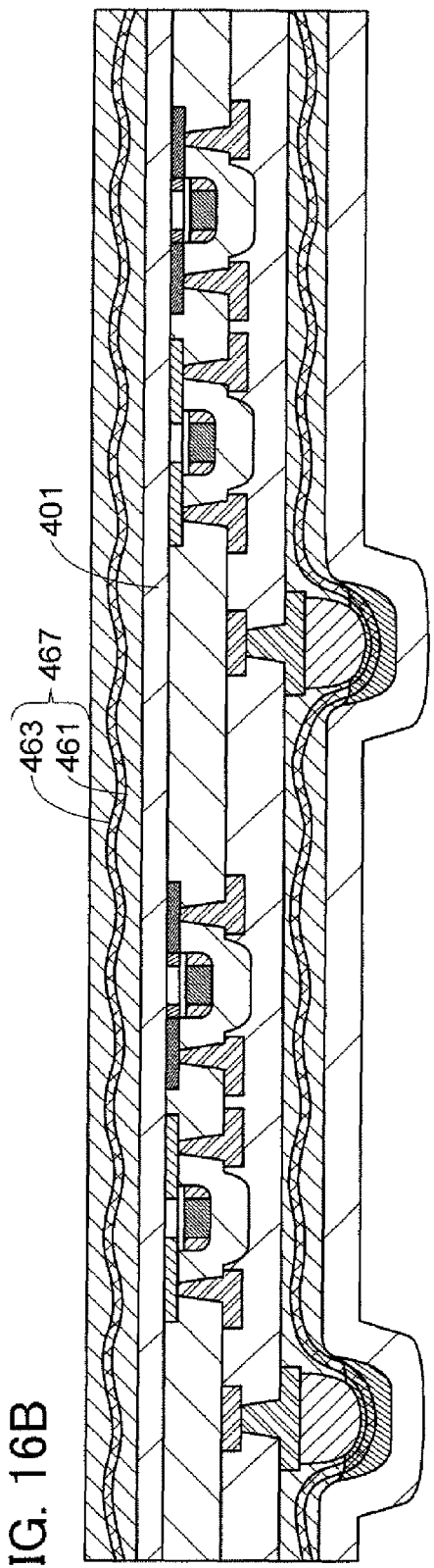
FIG. 16A
FIG. 16B

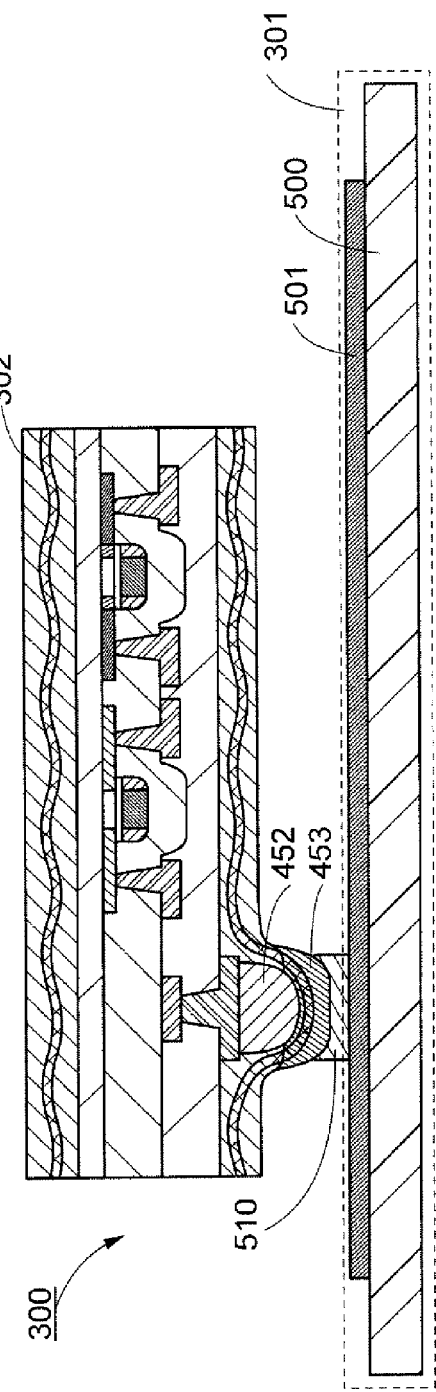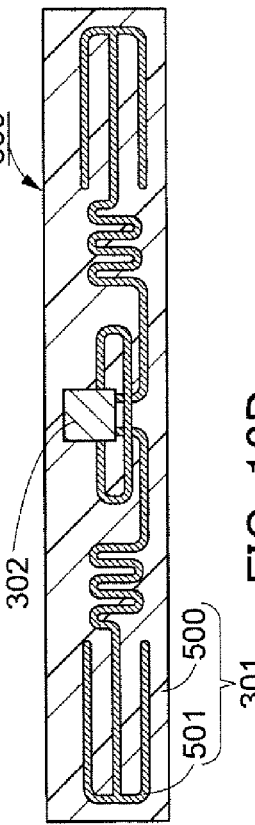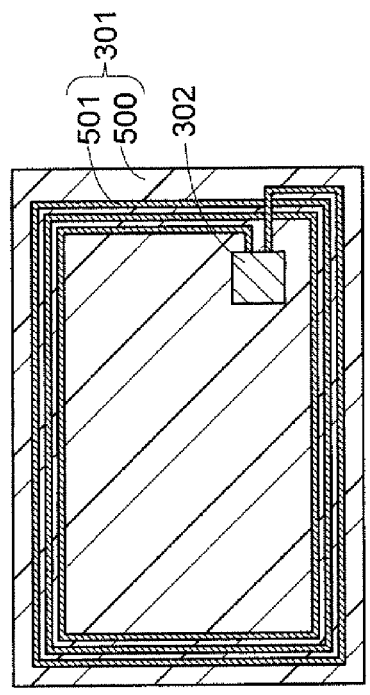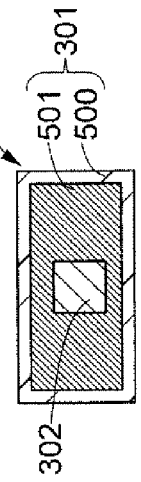

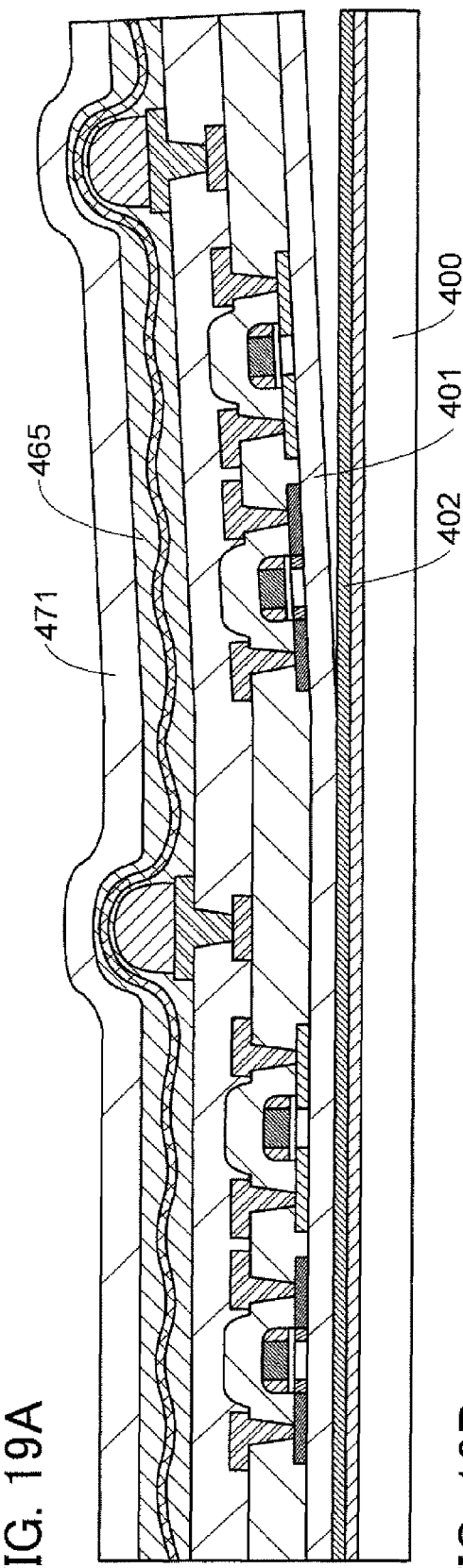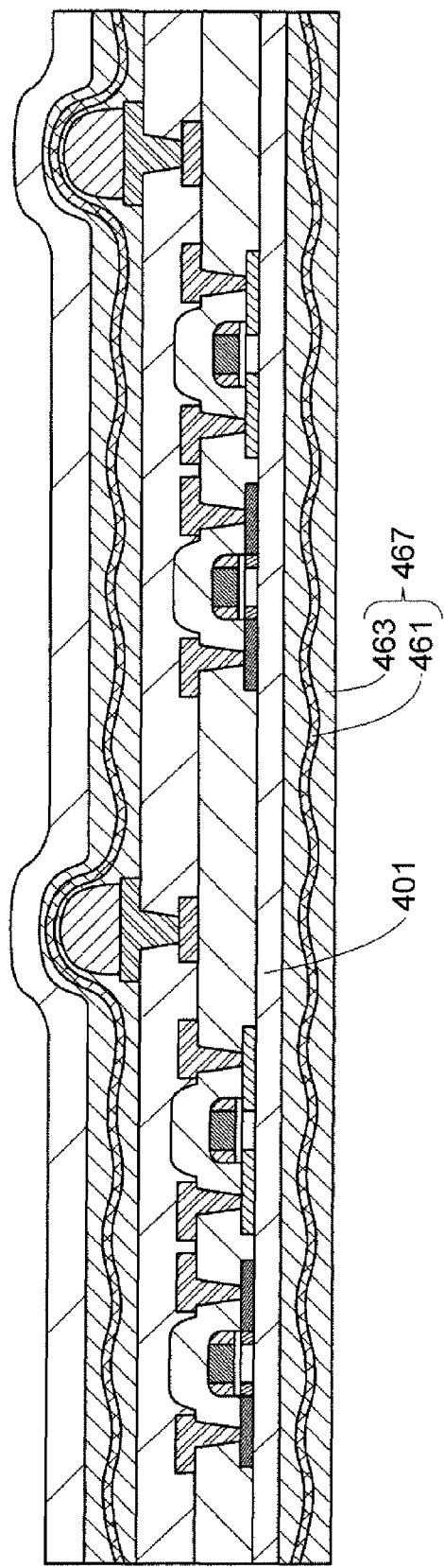

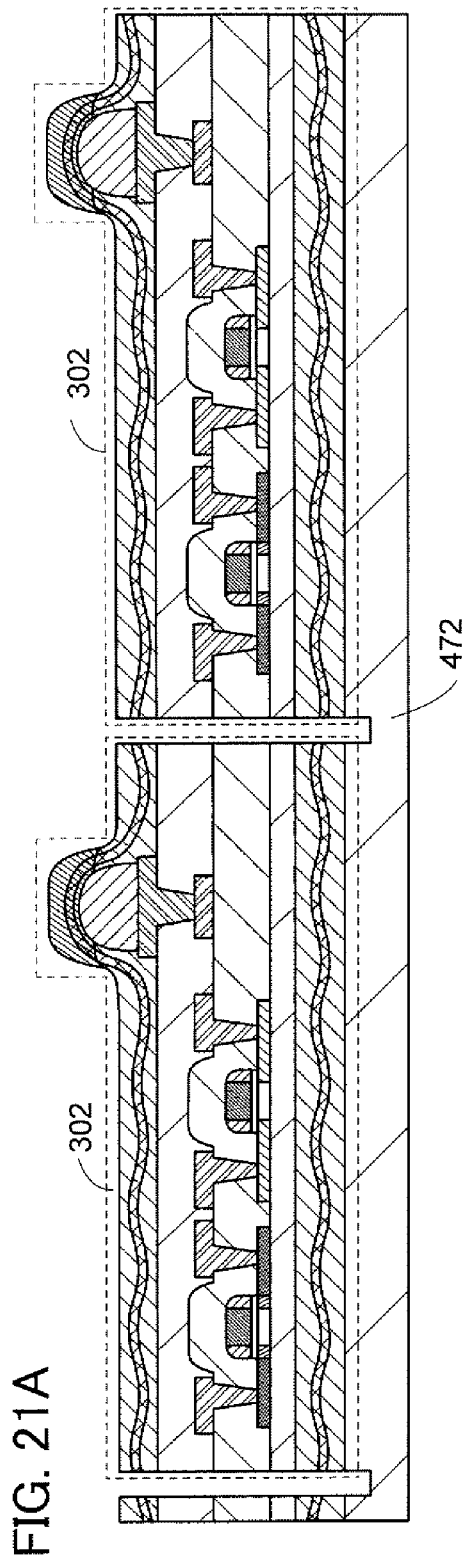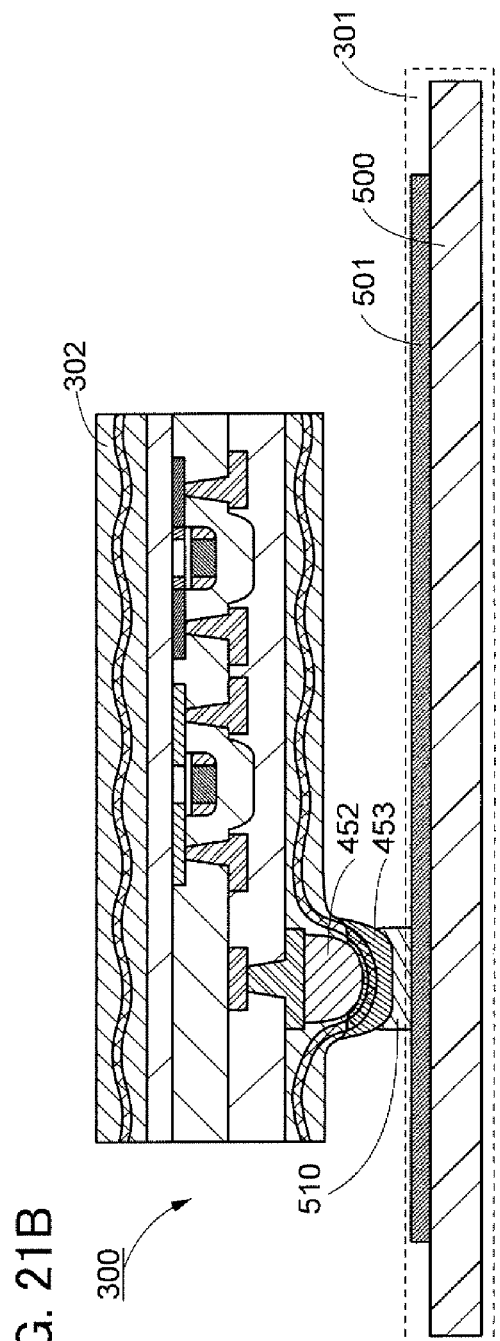
FIG. 21A
FIG. 21B

TERMINAL STRUCTURE AND MANUFACTURING METHOD THEREOF, AND ELECTRONIC DEVICE AND MANUFACTURING METHOD THEREOF

BACKGROUND OF THE INVENTION

1. Field of the Invention

In this specification, a terminal structure including a conductor covered with an insulating film will be described. Further, an electronic device provided with a terminal having such a structure will also be described.

2. Description of the Related Art

A resin layer formed by curing a prepreg including a reinforcing material such as a glass fiber or a glass filler is applied to a support, an insulating film, a protective material, or the like of a printed wiring board, an electronic device, or the like (for example, see Patent Documents 1 to 4). Since a multilayer wiring is formed, an opening penetrating a resin layer formed using a prepreg is formed in this layer in order to form an electrical connection portion with the external.

For example, Patent Document 1 discloses that an insulating layer of a printed wiring board is formed using a prepreg and an opening is formed in the insulating layer with laser treatment, drill treatment, or punch-out treatment.

Patent Documents 2 and 3 disclose that an opening is formed in a cured prepreg by performing a step of laser beam irradiation or a photolithography step in order to form a connection terminal for an electronic device sealed with the cured prepreg.

Patent Document 4 discloses that a support of an electronic component is formed using a prepreg and that a resin layer in which an electronic component and a conductor electrically connected to the electronic component are embedded is formed and a surface of the resin layer is grinded in order to expose the conductor.

REFERENCE

[Patent Document 1] Japanese Published Patent Application No. 2007-091822
[Patent Document 2] Japanese Published Patent Application No. 2008-257710
[Patent Document 3] Japanese Published Patent Application No. 2008-262547
[Patent Document 4] Japanese Published Patent Application No. 2002-290006

SUMMARY OF THE INVENTION

By using a prepreg including a reinforcing material, an electronic element can be sealed with a resin film including the reinforcing material; therefore, the strength of the electronic element can be increased. Meanwhile, in the case where an opening is formed in a sealing film in order to expose an extraction terminal of an electronic element, the reinforcing material is also needed to be removed with the resin film. The reinforcing material is troublesome when the opening is formed in the resin film.

As disclosed in Patent Document 1, an opening is formed in a resin film formed using a prepreg with drill treatment, punching treatment, and treatment with a laser beam. For formation of an opening in a resin film with which an electronic element is sealed, drill treatment and punching treatment are not suitable. Treatment with a laser beam is employed in order not to damage the electronic element.

However, the step of forming an opening with the use of a laser beam takes much time and skills are required because it is difficult to determine whether both the resin layer and the reinforcing material are removed. Thus, depending on the skill of an operator, a resin layer and/or a reinforcing material might be insufficiently removed and the areas of regions exposed in openings might vary. Accordingly, the values of connection resistance of two conductors electrically connected to each other through an opening vary, which makes it difficult to manufacture an electric element having electric characteristics with a designed value.

In addition, in the case of employing the step of forming an opening with the use of a laser beam, a mechanical impact on an electronic element is small as compared to drill treatment or a punching step; however, the possibility that performance of the electronic element is degraded by energy of a laser beam cannot be completely eliminated. In the study by inventors of the present invention, it is found that characteristics of an electronic element with a small size and a high-performance electronic element driven with low voltage are degraded due to laser beam irradiation in a step of forming an opening in a sealing layer in some cases.

A technical object in this specification is to improve reliability of a terminal structure including an insulating film formed by curing a prepreg including a reinforcing material.

Further, another technical object is to provide a method for forming an opening with high accuracy in an insulating film formed by curing a prepreg including a reinforcing material, with the use of a means other than laser beam irradiation.

A terminal structure according to one embodiment of the present invention includes a first conductor, a resin film including a reinforcing material and covering the first conductor, an opening formed in a region of the resin film, which overlaps with the first conductor and is provided with the reinforcing material, and a second conductor in contact with the first conductor in the opening.

Further, an electronic device according to one embodiment of the present invention includes an insulating film, one or a plurality of electronic elements covered with the insulating film, a conductor formed over the insulating film and electrically connected to at least one of the electronic elements, a resin film including a reinforcing material and covering the first insulating film and the conductor, and an opening formed in a region of the resin film, which overlaps with the conductor and is provided with the reinforcing material. In this embodiment, the electronic device can be electrically connected to another electronic device such as an antenna, a wiring substrate, or an integrated circuit with the use of the conductor electrically connected to the electronic element as a conduction region.

Furthermore, the electronic device according to this embodiment can be provided with another conductor which is closely attached to the conductor in the opening.

Furthermore, as the film in which the opening is formed, a resin film which does not include a reinforcing material can be used.

An electronic device according to one embodiment of the present invention includes a circuit including a plurality of electronic elements formed over a first insulating film, a second insulating film covering the plurality of electronic elements, a first conductor formed over the second insulating film and electrically connected to at least one of the electronic elements, a first resin film including a first reinforcing material and covering the second insulating film and the first conductor, an opening formed in a region of the first resin film, which overlaps with the first conductor and is provided with the reinforcing material, a second conductor in contact with the first conductor in the opening, and a second resin film including a second reinforcing material and covering the first insulating film side of the plurality of electronic elements. For example, an antenna can be electrically connected to the second conductor.

A method for manufacturing a terminal structure, according to an embodiment of the present invention, includes the steps of forming a conductor having a projecting portion over an insulating surface, closely attaching a prepreg including a reinforcing material to the insulating surface and a surface of the conductor so that a region of the prepreg, which is closely attached to the conductor, is thinner than the other region of the prepreg, curing the prepreg closely attached to the insulating surface and the surface of the conductor to form an insulating film including the reinforcing material, reducing a thickness of the insulating film without removal of the reinforcing material so that an opening is formed in a region of the insulating film, which overlaps with the first conductor, and forming a second conductor in contact with the first conductor at the opening.

In the above embodiment, the opening can be easily formed with high accuracy in the insulating film formed by curing the prepreg including the reinforcing material, with the use of a means other than laser beam irradiation. This is because according to this embodiment, the position where the opening is formed can be determined in a self-aligned manner depending on the position where the conductor having the projecting portion is formed, the accuracy of the position where an opening is formed can be ensured by the accuracy of the position where the conductor having the projecting portion is formed, and the shape and size of the opening can be controlled by changing the height and shape of the conductor. Therefore, in the step of forming the opening, highly accurate alignment like determination of a position where laser beam irradiation is performed is not necessary.

Further, in this embodiment, an insulating film may be formed using a prepreg which does not include a reinforcing material. In this case, the above advantageous effect can also be obtained.

A method for manufacturing an electronic device, according to an embodiment of the present invention, includes the step of forming over a first insulating film a conductor having a projecting portion, which is electrically connected to at least one electronic element, closely attaching a prepreg including a reinforcing material to an upper surface of the first insulating film and a surface of the conductor so that a region of the prepreg, which is closely attached to the conductor, is thinner than the other region of the prepreg, curing the prepreg closely attached to the upper surface of the first insulating film and the surface of the conductor to form a second insulating film including the reinforcing material, and reducing a thickness of the second insulating film without removal of the reinforcing material so that an opening is formed in a region of the second insulating film, which overlaps with the conductor.

Thus, in the method for manufacturing an electronic device, according to the above embodiment, as described above, the opening can be easily formed with high accuracy in the insulating film formed by curing the prepreg including the reinforcing material, with the use of a means other than laser beam irradiation.

Further, in the manufacturing method according to the above embodiment, part of the conductor may be removed in the step of reducing a thickness of the insulating film including the reinforcing material. Furthermore, an opening can be formed in the insulating film by reducing the thickness of the insulating film by etching.

Further, a step of forming another conductor electrically connected to the conductor can be added to the manufacturing method according to the above embodiment.

Further, in the manufacturing method according to the above embodiment, in the case where an electronic element is provided over a substrate used when the electronic element is formed, a step of separating the substrate from the electronic element may be performed. For example, this step is preferably performed with the electronic element sealed with the second insulating film after the second insulating film is formed. In that case, the substrate may be separated either before or after the opening is formed in the second insulating film.

A reinforcing material exists at an opening formed in a resin film including the reinforcing material, whereby the strength of a terminal and an electronic device can be increased.

Further, the accuracy of the position where an opening is formed in an insulating film (cured prepreg) including a reinforcing material is ensured in a self-aligned manner by the accuracy of the position where a conductor having a projecting portion is formed and the shape and size of the opening can be controlled by changing the height and shape of the conductor. Therefore, an opening can be easily formed in an insulating film including a reinforcing material with high accuracy with the use of a means other than laser beam irradiation.

BRIEF DESCRIPTION OF THE DRAWINGS

In the accompanying drawings:

FIGS. 12A to 12D are cross-sectional views illustrating an example of a method for manufacturing an electronic device, according to an embodiment of the present invention;

FIGS. 13A to 13D are cross-sectional views illustrating an example of steps following the step in FIG. 12D;

FIGS. 16A and 16B are cross-sectional views illustrating an example of steps following the step in FIG. 15B;

FIG. 18A is a cross-sectional view illustrating an example of a step following the step in FIG. 17 and FIGS. 18B to 18D are plan views each illustrating a structural example of the electronic device in FIG. 18A;

FIGS. 19A and 19B are cross-sectional views illustrating another structural example of steps following the step in FIG. 14C;

FIGS. 21A and 21B are cross sectional views illustrating an example of steps following the step in FIG. 20B.

DETAILED DESCRIPTION OF THE INVENTION

Figure 1A:
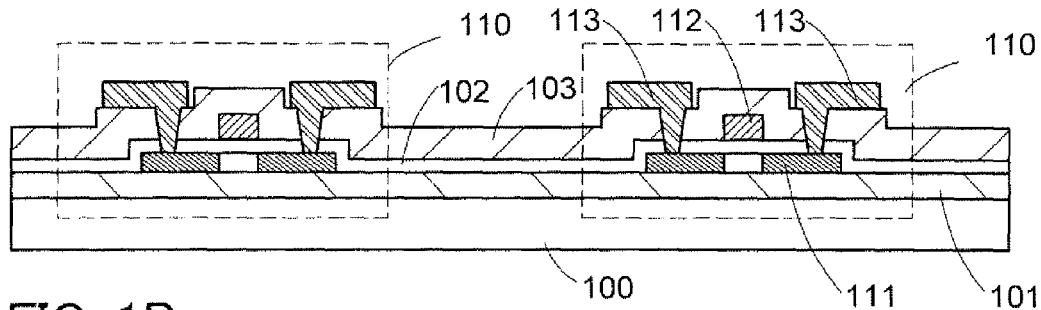
FIGS. 1A to 1D are cross-sectional views illustrating an example of a method for manufacturing an electronic device, according to one embodiment of the present invention.

Hereinafter, embodiments of the invention disclosed in this specification will be described with reference to the accompanying drawings. Note that in the drawings referred to in this specification, components denoted by the same reference numerals in different drawings represent the same components. Therefore, the description regarding such components, which is repetitive, will be omitted in some cases.

Further, it is easily understood by those skilled in the art that modes of the invention disclosed in this specification are not limited to the description in the embodiments and can be modified in various ways. That is, the invention disclosed in this specification should not be interpreted as being limited to the description of the embodiments.

Embodiment 1

In this embodiment, a terminal structure covered with a resin film formed from a cured prepreg or an insulating film including a reinforcing material and a method for manufacturing the terminal structure will be described. Further, in this embodiment, an electronic device provided with a terminal having such a structure and a method for manufacturing the electronic device will also be described.

A terminal structure of this embodiment includes a first conductor, a resin film including a reinforcing material and covering the first conductor, an opening formed in a region of the resin film, which overlaps with the first conductor and is provided with the reinforcing material, and a second conductor in contact with the first conductor in the opening.

In the terminal structure, a first conductor is formed over an insulating surface, for example. As the insulating surface, for example, a surface of an insulator such as an insulating film formed with a deposition method, e.g., a CVD method or a PVD method, oxidation treatment, or the like; a resin substrate; a resin film; a glass substrate; or a quartz substrate.

The electronic device of this embodiment includes one or more electronic elements, a first conductor having a projecting shape or having a projecting portion, which is electrically connected to at least one of the electronic elements, a resin film including a reinforcing material and covering an electronic element and the first conductor, an opening formed in a region of the resin film, which overlaps with the first conductor and is provided with the reinforcing material, and a second conductor electrically connected to the first conductor in the opening.

A method for manufacturing the terminal structure of this embodiment, a method for manufacturing the electronic device of this embodiment, and the structures of the terminal structure and the electronic device will be described with reference to FIGS. 1A to 1D, FIGS. 2A to 2C, FIGS. 3A and 3B, FIGS. 4A to 4C, and FIGS. 5A to 5C.

As illustrated in FIG. 1A, a substrate 100 over which one or more electronic elements 110 are formed with an insulating film 101 therebetween is prepared. There is no particular limitation on the electronic element 110 and a practitioner can determine the kind, the structure, the number, and the manufacturing method. As specific examples of the electronic element 110, a transistor, a resistor, a rectifier, a capacitor, a memory element, a photoelectric conversion element, a light-emitting element, a sensor element, and a wiring board are given.

In FIG. 1A, a transistor having an SOI structure is illustrated as an example of the electronic element 110 and the number of the transistors is one for simplification. As illustrated in FIG. 1A, a semiconductor layer 111, a conductive film 112 serving as a gate electrode, and a conductive film 113 serving as a source electrode and/or a drain electrode, which are in the transistor, are formed over the insulating film 101. Here, the insulating film 101 serves as a base insulating film of the transistor. The semiconductor layer 111 includes at least a channel formation region, a source region, and a drain region. The semiconductor layer 111 of the transistor is covered with an insulating film 102 and the conductive film 112 is formed over the insulating film 102. Here, the insulating film 102 serves as a gate insulating film of the transistor. The conductive film 112 is covered with an insulating film 103 and the conductive film 113 is formed over the insulating film 103.

As the substrate 100, a substrate such as a semiconductor substrate, a glass substrate, a quartz substrate, a sapphire substrate, a ceramic substrate, a stainless steel substrate, or a metal substrate can be used. As a semiconductor substrate, a silicon wafer obtained by slicing an ingot, an SOI substrate in which a single crystal semiconductor layer is formed over a substrate with an insulating film therebetween, or the like can be used. Further, in the case where a semiconductor wafer obtained by slicing an ingot is used as the substrate 100, the electronic element 110 including a semiconductor region can be formed over the silicon wafer (the substrate 100).

Each of the insulating films 101 to 103 has either a single-layer structure or a layered structure. Insulating films used as the insulating films 101 to 103 are selected in consideration of the condition of a manufacturing process of the electronic element 110 and the functions of these films. For example, an insulating film containing silicon and/or germanium as its component, such as a silicon oxide film, a silicon nitride film, a silicon oxynitride film, a silicon nitride oxide film, a germanium oxide film, a germanium nitride film, a germanium oxynitride film, or a germanium nitride oxide film can be used. Further, the following may be used: an insulating film formed from oxide of metal, such as aluminum oxide, tantalum oxide, or hafnium oxide; an insulating film formed from nitride of metal, such as aluminum nitride; an insulating film formed from oxynitride of metal, such as aluminum oxynitride; or an insulating film formed from nitride oxide of metal, such as aluminum nitride oxide. Furthermore, a resin film formed from a resin material such as acrylic, polyimide, polyamide, polyimide amide, or benzocyclobutene may be used. Note that in this specification, oxynitride is a substance in which the content of oxygen is higher than that of nitrogen and nitride oxide is a substance in which the content of nitrogen is higher than that of oxygen.

Typical examples of a method for forming these insulating films are as follows: a CVD method (chemical vapor deposition method) such as a PECVD (plasma-excited CVD) method or a thermal CVD method; a PVD method (physical vapor deposition method) such as a sputtering method or a vapor deposition method; an ALD method (atomic layer deposition method); a method for forming a film from a liquid or a paste material, such as a spin-coating method, a droplet discharging method, or a dip-coating method; solid-phase oxidation treatment or solid-phase nitridation treatment with plasma or heat; and the like.

Further, each of the conductive films 112 and 113 has either a single-layer structure or a layered structure. Each of the conductive films 112 and 113 can be formed using a metal film containing single metal such as tantalum, tungsten, titanium, molybdenum, aluminum, chromium, niobium, gold, silver, copper, or platinum, as its main component, an alloy film, a metal compound film, or the like. For example, as the metal film, a copper film, a pure aluminum film, and an aluminum film to which Si, Nb, or the like is added are given. As the alloy film, an aluminum-copper alloy film and an aluminum-neodymium alloy film are given. As the metal compound film, a metal nitride film such as a titanium nitride film or a tungsten nitride film, and a silicide film such as a nickel silicide film or a cobalt silicide film are given. These conductive films can be formed with a PVD method such as a sputtering method or a vapor deposition method; a method for forming a film from a liquid or a paste material, such as a printing method, a droplet discharging method, or a dip-coating method; a soldering method; a plating method; or the like.

Figure 1B:
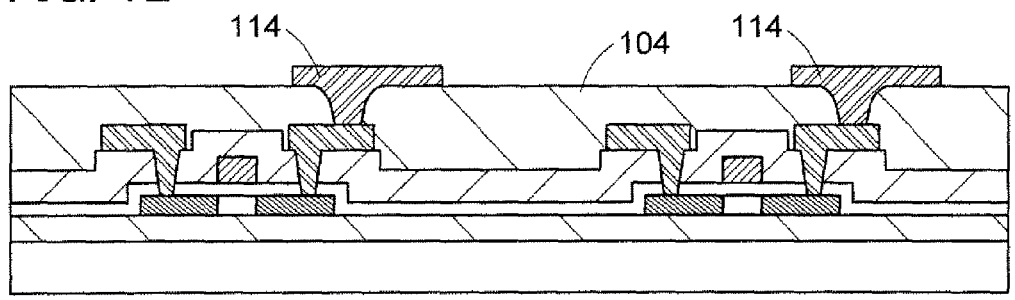

Next, as illustrated in FIG. 1B, the insulating film 104 is formed to cover the electronic element 110, and a conductive film 114 electrically connected to the conductive film 113 of the electronic element 110 is formed over the insulating film 104. The conductive film 114 is formed to electrically connect a conductive protrusion formed over the insulating film 104 to the electronic element 110 and constitutes a connection portion of the electronic element 110 included in the electronic device. Thus, the conductive film 114 is electrically connected to at least one of the electronic elements 110.

The insulating film 104 can be formed in a manner similar to those of the insulating films 101 to 103. For example, in the case where the insulating film 104 has a two-layer structure of a silicon nitride oxide film and a resin film, the insulating film 104 having openings can be formed as follows. First, a silicon nitride oxide film with a thickness of approximately 50 nm to 300 nm is formed over the insulating film 103 in a PECVD apparatus with the use of $SiH_4$, $N_2O$, $NH_3$, and $H_2$ for a source gas. Then, a film formed from an uncured photosensitive epoxy-phenol resin material is formed over the silicon nitride oxide film with a printing method. Next, the uncured resin film is irradiated with light having an appropriate wavelength to be cured, so that a resin film with a thickness of approximately 1 μm to 30 μm is formed. At this time, a portion of the resin film, which is to be a conduction region between the conductive film 113 and the conductive film 114, is not cured. After that, the silicon nitride oxide film in a first layer is etched, and thus, the insulating film 104 having the openings is completed.

Then, the conductive film 114 is formed over the insulating film 104. The conductive film 114 can be formed in a manner similar to those of the conductive films 112 and 113. For example, a titanium film is formed with a sputtering method and the titanium film is etched to form the conductive film 114.

Figure 1C:
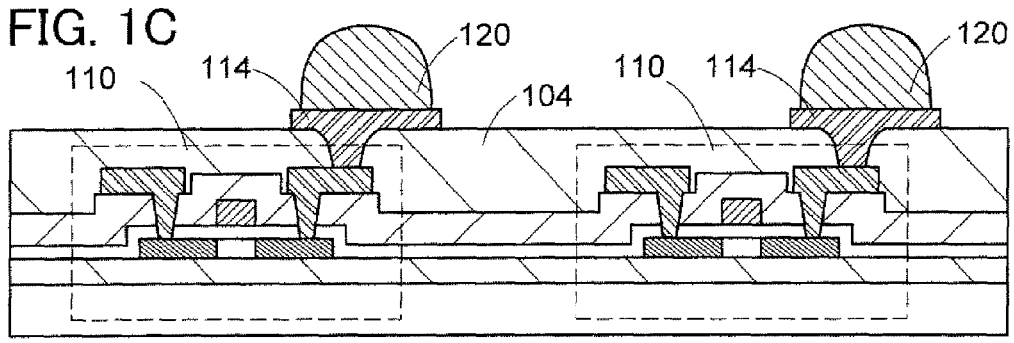

Next, protrusions 120 each formed using a conductor are formed over the insulating film 104 (an insulating surface) as illustrated in FIG. 1C. The protrusion 120 formed using a conductor is also referred to as a bump and may also be referred to as a conductor having a projecting portion. The protrusion 120 formed using a conductor (hereinafter referred to as the "protrusion 120") is electrically connected to at least one of the electronic elements 110 included in the electronic device. In this embodiment, the protrusion 120 is formed in close contact with the conductive film 114, whereby the protrusion 120 is electrically connected to the electronic element 110. Alternatively, the protrusion 120 may be formed in contact with the conductive film 113 without formation of the conductive film 114.

The protrusion 120 is preferably formed using a conductive material having fluidity, such as conductive paste containing a conductive microparticle or conductive powder or a conductive liquid containing a conductive microparticle or conductive powder. This is because when such a conductive material is used, the protrusion 120 can be formed with a droplet discharging method (including an ink jet method, a dispensing method, and the like), a printing method such as a screen printing method, or the like. These methods allow formation of a projecting conductor at a portion where the projecting conductor needed to be formed, without a deposition step using a complex deposition apparatus such as a CVD apparatus or a sputtering apparatus and an exposure step for forming a photomask.

The conductive paste and the conductive liquid are materials in which conductive particles or conductive powder is dispersed or conductive materials in which conductive particles or conductive powder is dissolved. For example, as a material of conductive powder or a conductive particle contained in the conductive liquid, metal such as Ag, Au, Cu, Ni, Pt, Pd, or Nb; an alloy of any of these metal materials (e.g., Ag—Pd); a conductive oxide material such as indium oxide or zinc oxide; and the like are given. Further, as a medium (a solvent or a dispersion medium) in which conductive powder or conductive particles are dissolved or dispersed, for example, precursor materials of a photocurable resin and a thermosetting resin are given. As a UV curable resin, an acrylic resin and an epoxy resin are given. As a thermosetting resin, a polyimide resin is given.

The protrusion 120 may be formed using solder paste.

Here, the protrusion 120 is formed using commercially available silver paste. The silver paste is formed in a projecting shape with a printing method in a region where the protrusion 120 is to be formed. Then, the silver paste is baked in an oven, so that the protrusion 120 containing silver is formed. The protrusion 120 protrudes from a top surface of the insulating film 104 as compared to any portion.

Next, an uncured (incompletely cured) prepreg 130 including a reinforcing material 131 is prepared, and the uncured prepreg 130 (hereinafter referred to as the "prepreg 130") is closely attached to surfaces of the insulating film 104 and the protrusions 120. The prepreg 130 is cured in such a state, and thus, the surfaces of the insulating film 104 and the protrusions 120 are covered with an insulating film 140 including the reinforcing material 131 (see FIG. 1D and FIGS. 2A and 2B). The insulating film 140 functions as a sealing film of the electronic elements 110 (electronic devices).

Figure 1D:
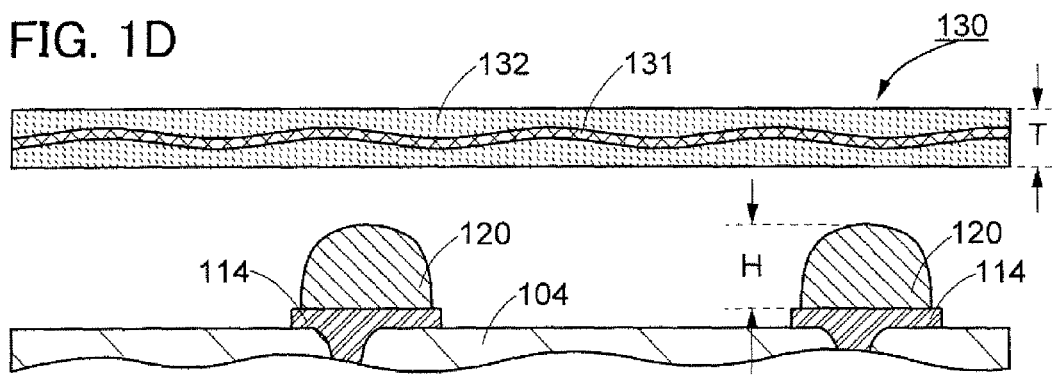

As illustrated in FIG. 1D, the uncured prepreg 130 is formed from an uncured resin 132 including the reinforcing material 131. Note that the prepreg 130 does not necessarily include the reinforcing material 131. The prepreg 130 including the reinforcing material 131 is preferably used because the terminal structure and the electronic device can be reinforced.

As a resin material of the uncured resin 132 (hereinafter referred to as the "resin 132"), a thermosetting resin such as an epoxy resin, an unsaturated polyester resin, a polyimide resin, a bismaleimide-triazine resin, or a cyanate resin can be used. Alternatively, a thermoplastic resin such as a polyphenylene oxide resin, a polyetherimide resin, or a fluorine resin may be used. For example, when the resin 132 is formed from a polyimide resin, the resin 132 is cured to form a resin layer formed from a polyimide resin. Note that the number of resin materials used for the resin 132 is not limited to one and a plurality of resin materials may be used.

Note that in this specification, an uncured resin layer and an uncured prepreg refer to both those in an uncured state and those in an incompletely cured state. The latter state is also referred to as a semi-cured state.

As the reinforcing material 131 used for the prepreg 130, fiber, a sheet fibrous body (also referred to as a fibrous sheet), a filler, and the like are given. The sheet fibrous body is a sheet substance formed using fiber and for example, a woven fabric and a nonwoven fabric each correspond to the sheet fibrous body. The way of weaving a woven fabric used for the sheet fibrous body is not particularly limited and for example, a plain-woven fabric, a twilled fabric, a satin-woven fabric, or the like can be used as the sheet fibrous body.

High-strength fiber is preferably used as fiber used for the reinforcing material 131. The high-strength fiber is specifically fiber with a high modulus of elasticity in tension or fiber with a high Young's modulus. As the high-strength fiber, a polyvinyl alcohol fiber, polyester fiber, polyamide fiber, polyethylene fiber, aramid fiber, polyparaphenylene benzobisoxazole fiber, glass fiber, carbon fiber, and the like are given. As the glass fiber, glass fiber using E glass, S glass, D glass, Q glass, or the like is given. For example, a woven fabric formed from glass fiber is called glass cloth.

There is no particular limitation on a yarn bundle (e.g., the cross-sectional shape or the processing method) used for the reinforcing material 131. The cross-sectional shape may be a circular shape, an elliptical shape, or a flat shape. A sheet fibrous body formed using a yarn bundle which has been subjected to fiber opening is preferably used for the reinforcing material 131 because the yarn bundle subjected to fiber opening has a large width, has a smaller number of single yarns in the thickness direction, and thus is easily flattened in cross section. Flattening the yarn bundle in cross section makes the thickness of the fibrous body small, which reduces the thickness of the reinforcing material 131. Accordingly, the uncured prepreg 130 can be thin.

Figure 2A:
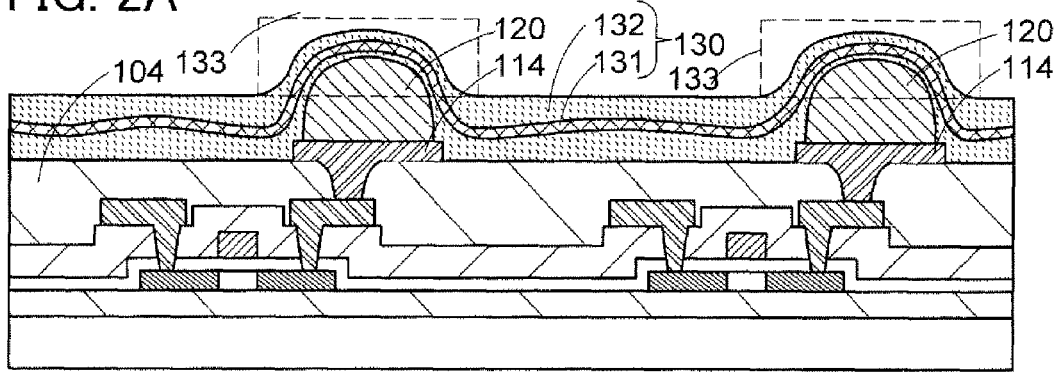
FIGS. 2A to 2C are cross-sectional views illustrating an example of steps following the step in FIG. 1D.
Figure 2B:
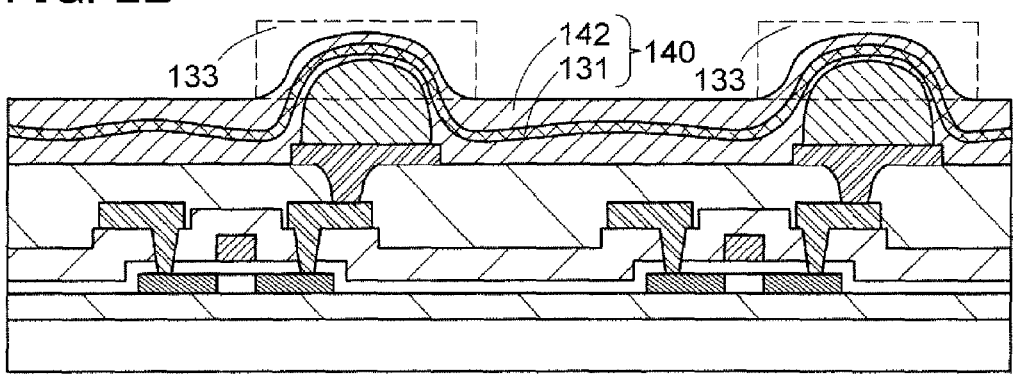

In the case where the resin 132 is a thermosetting resin, a step of closely attaching the prepreg 130 to the surfaces of the insulating film 104 and the protrusions 120 and a step of curing the prepreg 130 can be performed using a vacuum heat press. As illustrated in FIG. 1D, the prepreg 130 is placed on the insulating film 104 side and the prepreg 130 and the substrate 100 are pressed, so that the prepreg 130 is closely attached to the surfaces of the insulating film 104 and the protrusions 120 as illustrated in FIG. 2A. The prepreg 130 is heated while being pressed using a vacuum press, whereby the prepreg 130 is cured (solidified). Thus, the insulating film 140 including the reinforcing material 131 is formed as illustrated in FIG. 2B. In the insulating film 140, a resin 142 corresponds to the resin 132 which has been cured. Therefore, the insulating film 140 can also be referred to as a resin film including the reinforcing material 131.

In the case where the resin 132 is a photocurable resin, the prepreg 130 may be cured as follows. The prepreg 130 and the substrate 100 are pressed with a vacuum press (or a vacuum heat press), whereby the prepreg 130 is closely attached to the surfaces of the insulating film 104 and the protrusions 120 as illustrated in FIG. 2A. After that, light irradiation is performed so that the prepreg 130 is cured.

In this embodiment, in the step of attaching the prepreg 130 to the insulating film 104 (the step in FIG. 2A), the prepreg 130 is closely attached to the upper surface of the insulating film 104 and the surface of the protrusions 120 so that regions of the prepreg 130, which cover the protrusions 120, each have a portion with a thickness smaller than the thickness of the other region. This is described with reference to FIG. 2A.

In the prepreg 130, portions each having a thickness smaller than the thickness of the other region are formed in regions (regions 133 which are surrounded by dotted lines) where the prepreg 130 is closely attached to the protrusions 120. Since the protrusions 120 protrude above the upper surface of the insulating film 104, the uncured resin 132 is stretched by the protrusions 120 in such a manner that the prepreg 130 is closely attached to the insulating film 104 and the protrusions 120, with the result that the portions of the prepreg 130 in the region 133 each have a thickness smaller than the thickness of the other region.

In order that the prepreg 130 is attached with high productivity so that the regions 133 where the prepreg 130 is in contact with the protrusions 120 each have a thickness smaller than the thickness of the other region (a region in contact with the insulating film 104), the height H (the thickness H) of the protrusion 120 protruding above the upper surface of the insulating film 104 is preferably larger than or equal to half the thickness T of the prepreg 130 which has not subjected to the attaching step (see FIG. 1D). That is, $H \geq T/2$ is preferably satisfied.

Figure 2C:
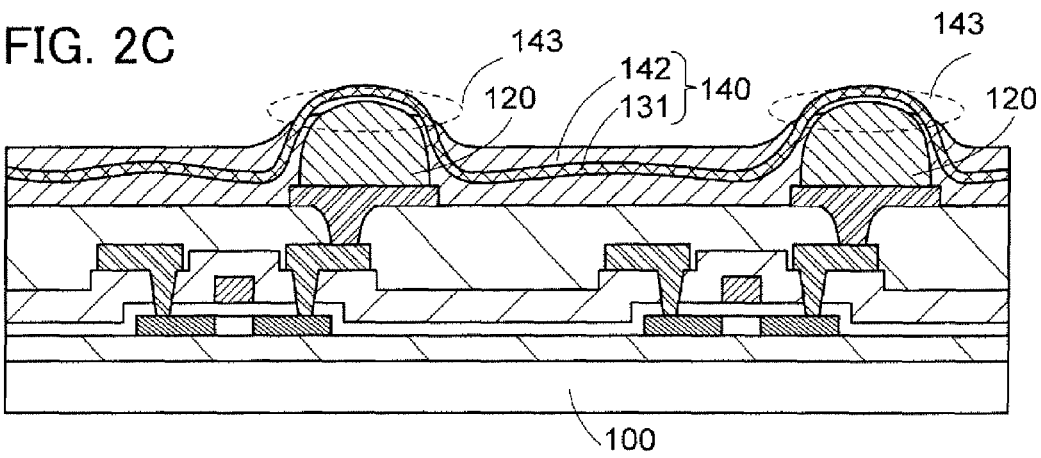

Next, as illustrated in FIG. 2C, openings 143 are formed in the regions 133 of the insulating film 140 in such a manner that the thickness of the entire insulating film 140 is reduced. Formation of the opening 143 can be performed, for example, by etching of the entire insulating film 140. Further, as the etching, anisotropic etching such as dry etching is preferable. This is because in the anisotropic etching, the etching rate in the perpendicular direction is faster than the etching rate in the horizontal direction. In the structure illustrated in FIG. 2B, a portion of the resin 142 in the region 133, which covers an upper portion of the protrusion 120, has a thickness smaller than the thickness of the other region. Therefore, when the insulating film 140 is subjected to anisotropic etching, the resin 142 in this portion is first to be removed, so that the amount of the resin 142 existing in the other region, which is to be etched, can be reduced. Thus, when anisotropic etching is applied, an allowable range of etching time is widened as compared to isotropic etching; accordingly, a function of the insulating film 140 as a sealing film or a protective film can be easily secured.

Note that in isotropic etching such as wet etching, etching in the horizontal direction and etching in the perpendicular direction proceed isotropically; therefore, in the case where the opening 143 is formed by isotropic etching, the resin 142 may be left at the end of etching so that the insulating film 140 can function as a sealing film or a protective film. For that purpose, it is preferable to make the prepreg 130, which is used, thick, and to make the difference large between the thickness of a portion of the resin 142, which exists in the region 133, and the thickness of a portion of the resin 142, which exists in the other region, for example.

Further, as the protrusion 120, a conductor provided with a projecting portion can be provided in the region (the region 133) where the opening 143 is formed. Such a conductor partly provided with a projecting portion can include a portion forming a terminal of the electronic device and a portion forming an electrode or a wiring.

Further, this step is preferably performed by etching treatment in which the resin 142 of the insulating film 140 is removed but the reinforcing material 131 is not removed. This is because the strength of a terminal portion of the electronic device can be increased with the reinforcing material 131 over the protrusion 120. Etching (ashing) treatment with the use of an etching gas such as an oxygen gas can be given as an example of such etching treatment.

It is not necessary to reduce the thickness of the insulating film 140 until the portion of the resin 142, which exists in the region 133, is entirely removed. As illustrated in FIG. 2C, the opening 143 may be formed at each of the protrusions 120 formed over the substrate 100.

Further, in the case where this step is performed by etching, the protrusion 120 may be removed together with the resin 142. In this case, in the step in FIG. 1C, the thickness (height H) of the protrusion 120 may be determined in consideration of the thickness of a portion of the protrusion 120, which is to be removed in etching. The height H of the protrusion 120 is set high, whereby a time for etching treatment can be easily controlled and variation in etching treatment can be suppressed. Further, the size of the opening 143 formed in the insulating film 140 can be controlled in accordance with the thickness of the portion of the insulating film 140, which is to be removed.

Therefore, in this embodiment, variation in area of the opening 143 can be reduced as compared to the step of forming the opening 143 with the use of a laser beam. Accordingly, variation in electric characteristics of the electronic device can be reduced, which increases reliability of the electronic device itself.

Thus, as the height of the protrusion 120 is increased in the step in FIG. 1C, the allowable range within which the areas of the plurality of openings 143 on the substrate 100 vary can be broadened. As the size of the substrate is increased, the areas of the openings 143 of the insulating film 140 over the substrate 100 are likely to vary; therefore, increasing the height of the protrusion 120 is advantageously effective. In order that the plurality of openings 143 is reliably formed in the insulating film 140, the thickness of portions of the insulating film 140, which are to be removed, may be increased. Alternatively, the height of the protrusion 120 may be set high and the amount of portions of the insulating film 140, which are to be removed, may be increased.

The opening 143 in this embodiment is formed in such a manner that a portion of the insulating film 140, which has a thickness smaller than the thickness of a portion in the other region, is formed in the region 133 where the opening 143 is to be formed and the entire insulating film 140 is reduced in thickness; accordingly, the opening 143 can be easily formed in a selective manner in the portion where the protrusion 120 exists. That is, the position where the opening 143 is formed in the insulating film 140 is determined in a self-aligned manner in accordance with the position of the protrusion 120. Accordingly, a light exposure step of forming a photo resist mask is not required for this etching treatment. Further, the alignment accuracy for formation of the openings 143 is ensured by the alignment accuracy in the step of forming the protrusions 120. Therefore, the skill of the operator is not so important in the step of forming the openings 143 in this embodiment as compared to a step in which a laser beam is used.

Figure 3A:
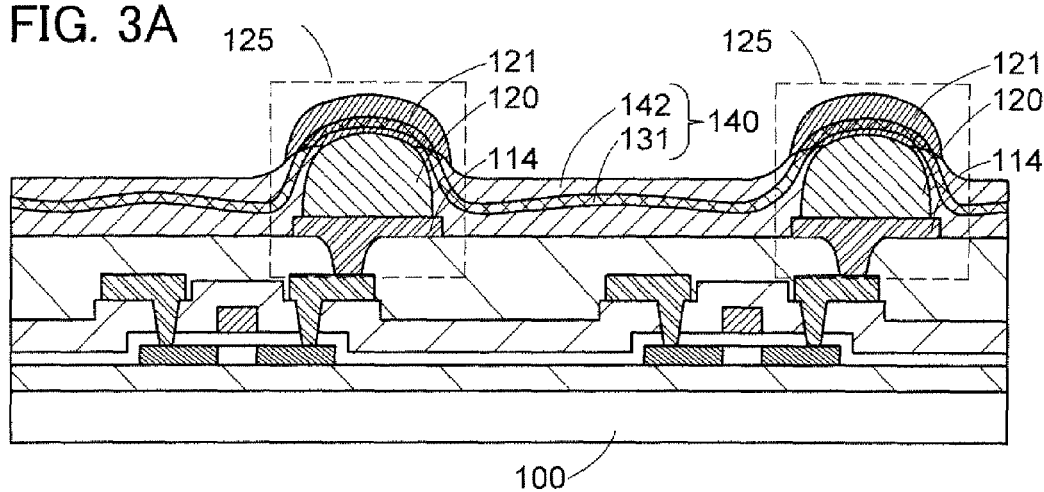
FIGS. 3A and 3B are cross-sectional views illustrating an example of steps following the step in FIG. 2C.

Next, as illustrated in FIG. 3A, conductors 121 which are electrically connected to the protrusions 120 in the openings 143 are formed. The conductor 121 can be formed using a conductive material having fluidity, such as conductive paste containing a conductive microparticle or conductive powder, or conductive liquid containing a conductive microparticle or conductive powder, in a manner similar to that of the protrusion 120 in FIG. 1C. The conductor 121 can be formed using such a conductive material to have a predetermined shape over the opening 143 and the insulating film 140 by a droplet discharging method (including an ink-jet method, a dispensing method, and the like), a printing method such as a screen printing method, or the like. Since the conductive material passes through the reinforcing material 131, the conductor 121 can be formed using such a conductive material in a state where the reinforcing material 131 is in contact with the protrusion 120 at the opening 143. Then, the conductive material is cured (solidified) by an appropriate method such as heat treatment, light irradiation, or the like, whereby the conductor 121 can be formed.

Thus, in the electronic device, a terminal portion 125 including the protrusion 120 and the conductor 121 is formed. Further, the conductor 121 may include not only a portion forming the terminal portion 125 of the electronic device but also a portion forming a wiring or another electrode.

Note that in the case where electric connection with another electric device is possible with the use of the protrusion 120 without formation of the conductor 121, the conductor 121 is not necessarily formed.

Figure 3B:
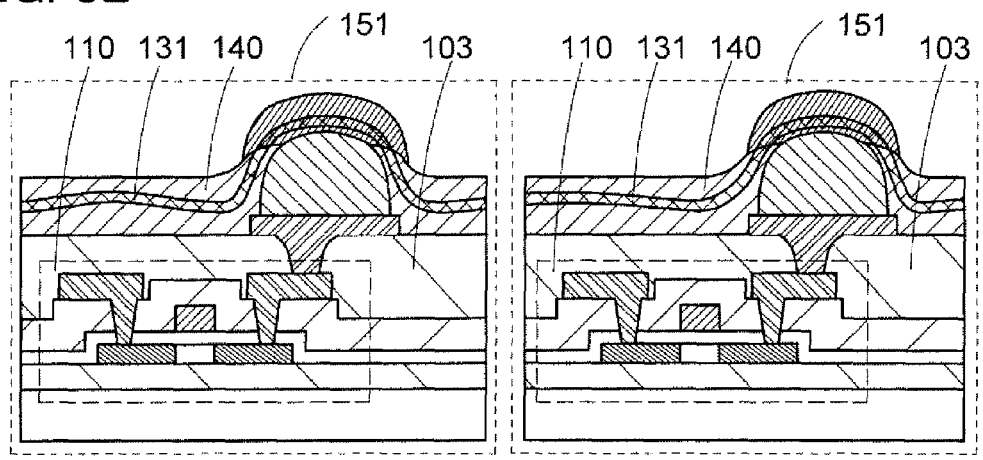

After the step illustrated in FIG. 3A is completed, a stack formed over the substrate 100 is cut so that individual electronic devices 151 are obtained (see FIG. 3B). This step can be performed with treatment such as dicing or scribing. Before the stacked formed over the substrate 100 is cut, the substrate 100 may be thinned by performing grinding treatment, polishing treatment, or the like.

As illustrated in FIG. 3B, the electronic device 151 includes the one or more electronic elements 110 covered with the insulating film 104, the protrusion 120 which is formed over the insulating film 104 and formed using a conductor electrically connected to at least one of the electronic elements 110, and the insulating film 140 including the reinforcing material 131 and covering the protrusion 120 and the insulating film 104. The insulating film 140 forms a sealing film on the terminal portion 125 side of the electronic device 151. Further, the opening 143 is formed in a portion of the insulating film 140, which is provided with the protrusion 120. The conductor 121 is electrically connected to the protrusion 120 in the opening 143 and has a structure capable of electrical connection to another electronic device. Thus, the electronic device 151 can be electrically connected to another electronic device (such as an integrated circuit, a wiring circuit, or an antenna) through the conductor 121.

In the method for manufacturing the terminal portion 125 in this embodiment, the reinforcing material 131 can also be provided in the terminal portion 125, whereby the strength of the electronic device 151 can be increased as compared to a device manufactured through a step of forming an opening with a laser beam.

Figure 4A:
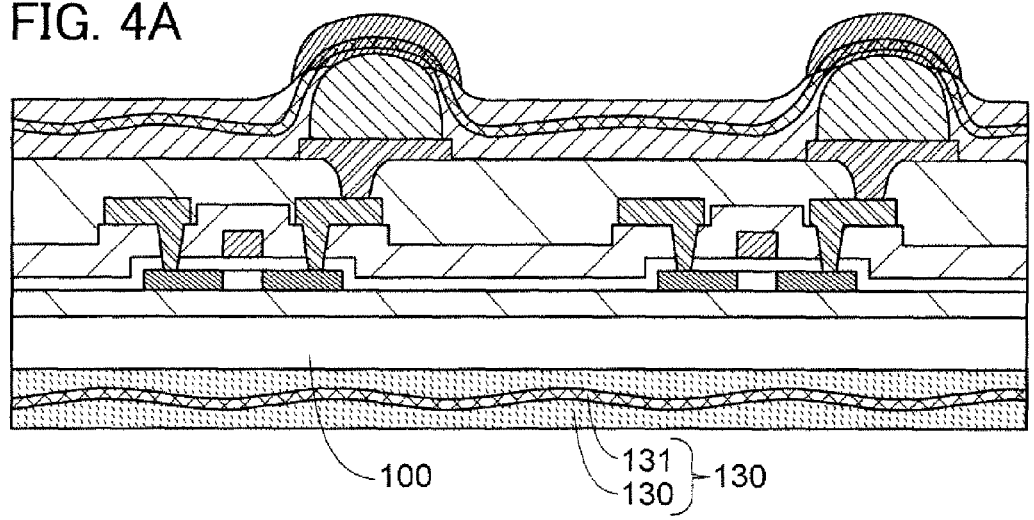
FIGS. 4A to 4C are cross-sectional views illustrating an example of steps following the step in FIG. 3A.
Figure 4B:
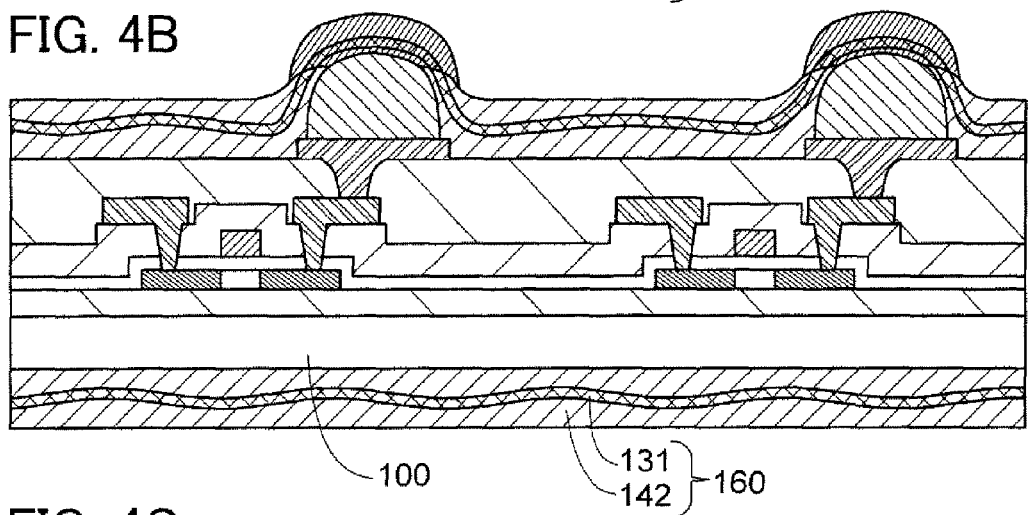
Figure 4C:
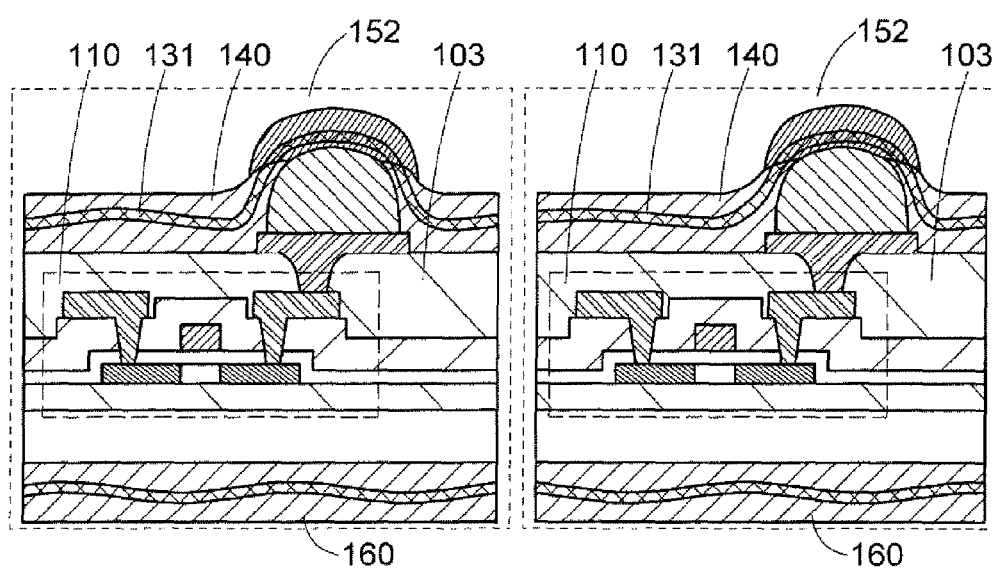

Further, as illustrated in FIG. 4A, before the stack formed over the substrate 100 is cut, the prepreg 130 including the reinforcing material 131 may also be attached to a surface of the substrate 100, which is not provided with the stack. Then, the prepreg 130 is cured to form an insulating film 160 which covers the surface of the substrate 100, which is not provided with the stack, as illustrated in FIG. 4B. The insulating film 160 is formed from the resin 142 including the reinforcing material 131 as in the insulating film 140. Note that the insulating film 160 may be formed using a prepreg which does not include the reinforcing material 131. Then, as illustrated in FIG. 4C, a stack between the insulating film 140 and the insulating film 160 is cut so that individual electronic devices 152 are obtained. The insulating film 160 serves as a sealing film on the substrate 100 side. The structure of the electronic device 152 is similar to that of the electronic device 151 in FIG. 3B except that the insulating film 160 including the reinforcing material 131 is formed on the surface of the substrate 100, which is not provided with the stack.

Figure 5A:
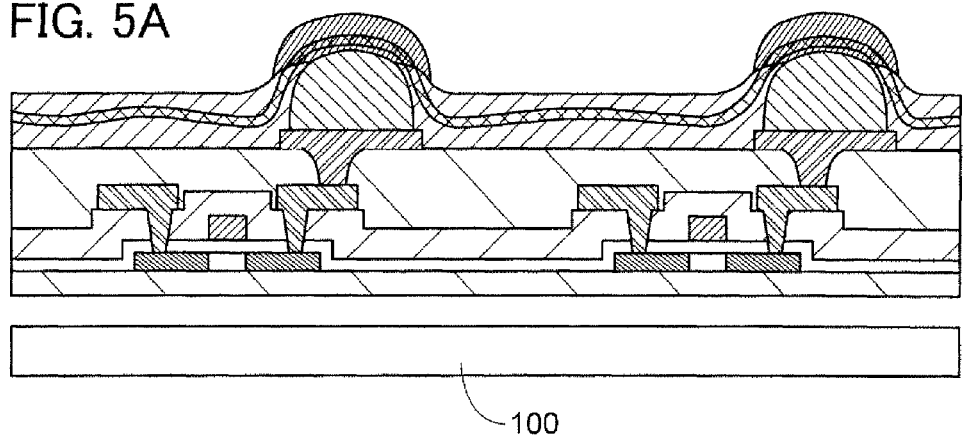
FIGS. 5A to 5C are cross-sectional views illustrating an example of steps following the step in FIG. 3A.
Figure 5B:
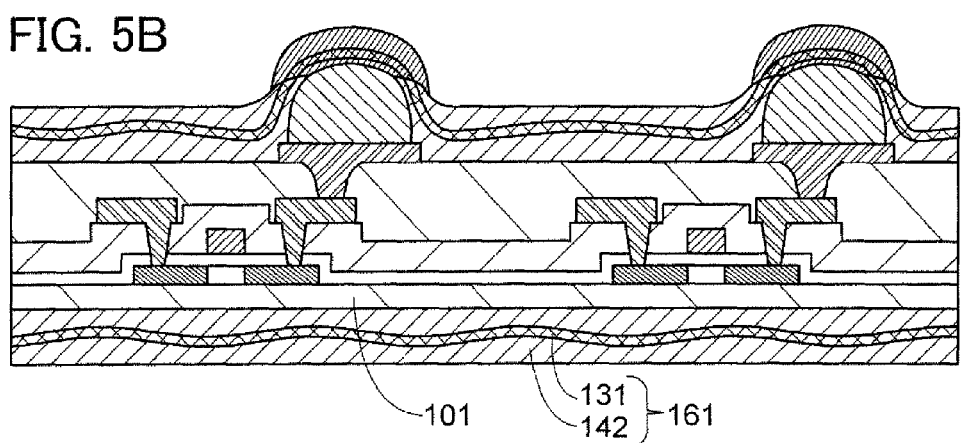

As illustrated in FIG. 5A, the substrate 100 used for manufacture of the electronic element 110 may be separated from the electronic element 110. Then, the prepreg 130 including the reinforcing material 131 is attached to the insulating film 101 and after that, the prepreg is cured to form an insulating film 161 which covers the insulating film 101. The insulating film 161 is formed from the resin 142 including the reinforcing material 131 as in the insulating film 140. Note that the insulating film 161 may be formed using a prepreg which does not include the reinforcing material 131.

Figure 5C:
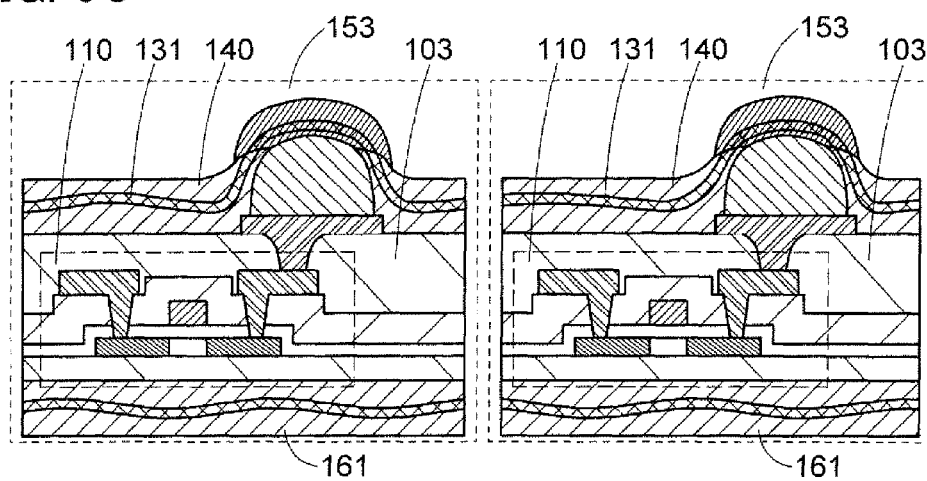

Then, as illustrated in FIG. 5C, a stack between the insulating film 140 and the insulating film 161 is cut so that individual electronic devices 153 are obtained. The insulating film 161 serves as a sealing film on the insulating film 101 side.

The step of separating the substrate 100 may be performed before the openings are formed in the insulating film 140. In that case, steps up to and including the step in FIG. 2B are performed, the substrate 100 is separated, and the insulating film 161 is formed. After that, as illustrated in FIG. 2C, the openings 143 are formed in the insulating film 140.

The structure of the electronic device 153 is similar to that of the electronic device 151 in FIG. 3B except that the substrate 100 is removed and the insulating film 161 including the reinforcing material 131 is formed on the insulating film 101. By removing the substrate 100 in such a manner, the electronic device 153 which can be curved or bended can be manufactured.

As described above, in this embodiment, accuracy of the position where an opening is formed in an insulating film (resin film) including a reinforcing material is ensured in a self-aligned manner by the accuracy of the position where a conductor having a projecting portion (or a protrusion) is formed and the shape and size of the opening can be controlled by changing the height and shape of the conductor having a projecting portion (or the protrusion). Therefore, by applying this embodiment, the opening can be formed in the insulating film including the reinforcing material with high accuracy and with great ease as compared to the case where a laser beam is used. Accordingly, a terminal structure and an electronic device can have higher reliability.

The method by which an opening is formed in an insulating film formed using a prepreg including a reinforcing material is described in this embodiment; however, this embodiment can also be applied to the case where an opening is formed in an insulating film formed using a prepreg which does not include a reinforcing material, which brings a similar advantageous effect.

This embodiment can be combined with any of the other embodiments as appropriate.

Embodiment 2

In this embodiment, a sheet fibrous body which can be applied to the reinforcing material 131 of the prepreg 130 illustrated in FIG. 1D will be described.
[Structure Example 1 of Sheet Fibrous Body]

Figure 6A:
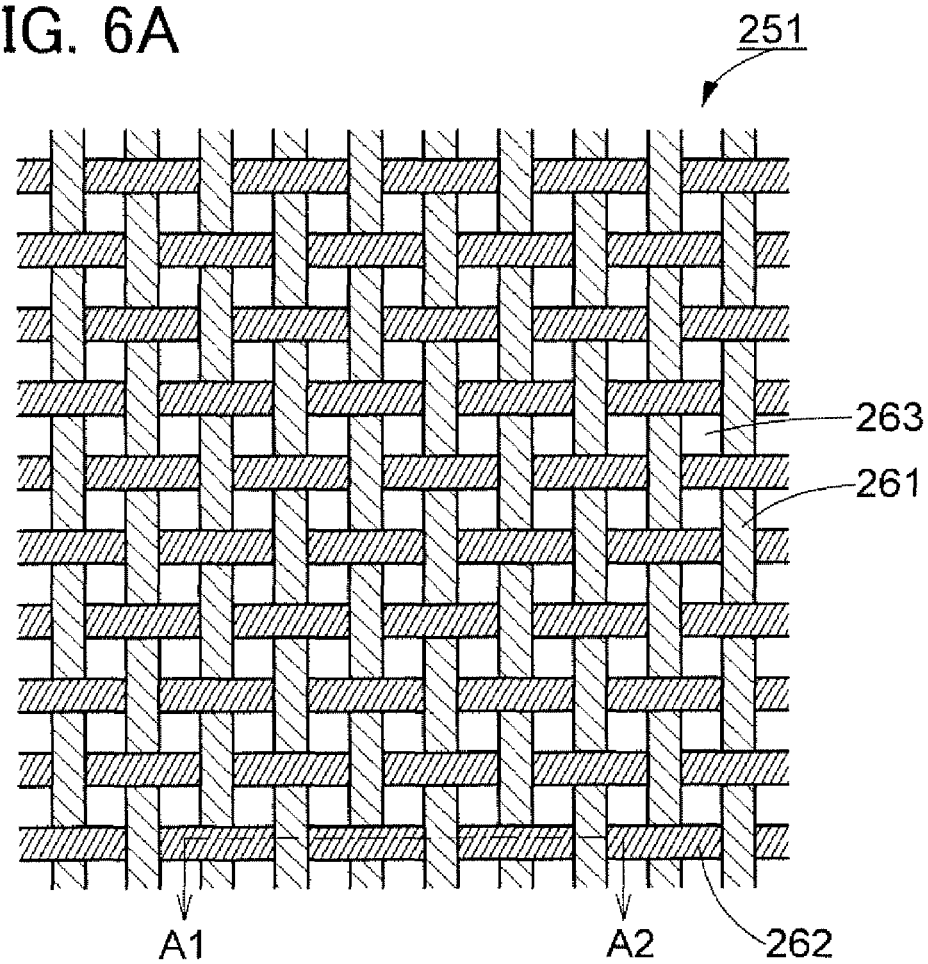
FIG. 6A is a plan view illustrating an example of a structure of a sheet fibrous body applied to a prepreg in FIG. 1D
Figure 6B:
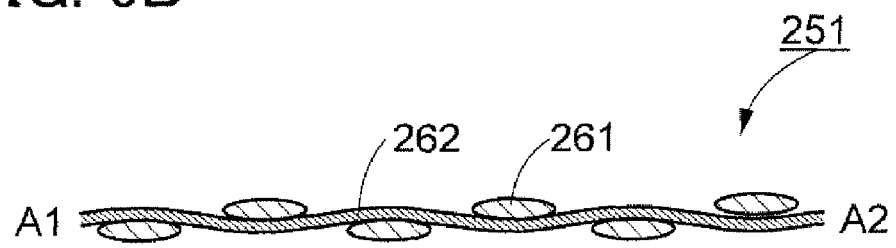
FIG. 6B is a cross-sectional view taken along line A1-A2 in FIG. 6A.

FIG. 6A is a plan view illustrating an example of a structure of a sheet fibrous body 251, and FIG. 6B is a cross-sectional view illustrating the example of the structure of the sheet fibrous body 251, which is taken along line A1-A2 in FIG. 6A.

As illustrated in FIG. 6A, the sheet fibrous body 251 is a plain-woven fabric which is obtained by alternately weaving a warp yarn 261 and a weft yarn 262 so that they intersect with each other. The sheet fibrous body 251 has basket holes 263 each of which is a region including neither the warp yarn 261 nor the weft yarn 262. The conductive material provided for forming the conductor 121 passes through the basket holes 263, so that the conductor 121 and the protrusion 120 can be in contact with each other.

There is no particular limitation on a yarn bundle (the warp yarn 261 and the weft yarn 262) (e.g., the cross-sectional shape or the processing method) used for the sheet fibrous body 251. The cross-sectional shape may be a circular shape, an elliptical shape, or a flat shape. A yarn bundle which has been subjected to fiber opening is preferably used for the warp yarn 261 and the weft yarn 262 because the yarn bundle subjected to fiber opening has a large width, has a smaller number of single yarns in the thickness direction, and thus is easily flattened in cross section. For example, as illustrated in FIG. 6B, by using the warp yarn 261 having a flat cross section and the weft yarn 262 having a flat cross section, the sheet fibrous body 251 can be thin.
[Structure Example 2 of Sheet Fibrous Body]

Figure 7:
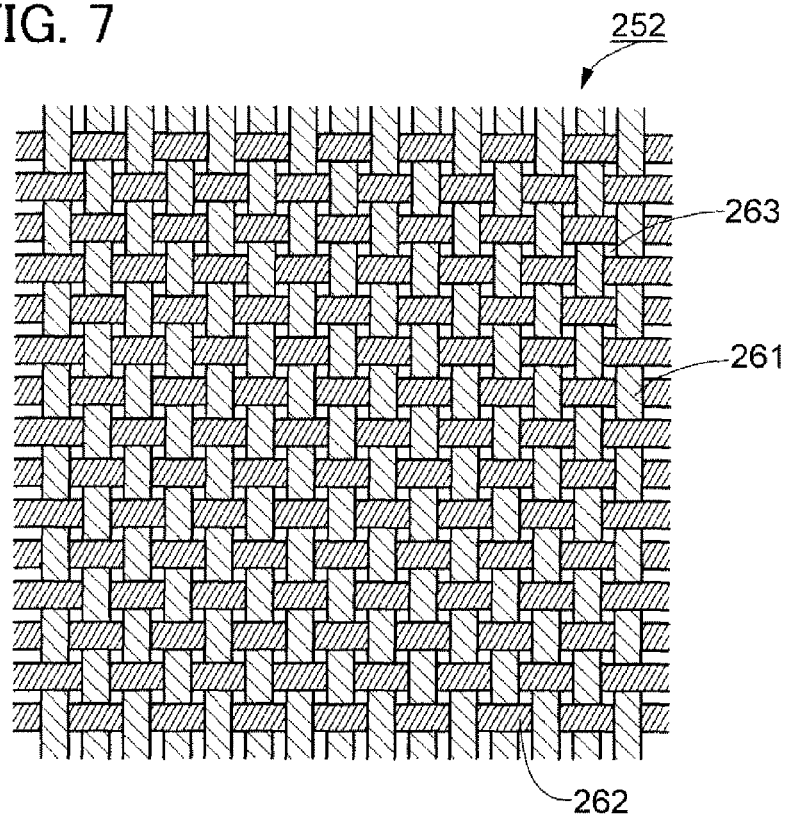
FIG. 7 is another example of a structure of a sheet fibrous body applied to a prepreg in FIG. 1D.

As a means for increasing the strength of a cured prepreg, reduction in area of a basket hole of a sheet fibrous body can be given. FIG. 7 illustrates a plan view of a sheet fibrous body 252 having such a structure example. As illustrated in FIG. 7, the sheet fibrous body 252 is a plain-woven fabric which is obtained by alternately weaving a warp yarn 261 and a weft yarn 262 so that they intersect with each other, like the sheet fibrous body 251. In the sheet fibrous body 252, the density of the warp yarn 261 and the weft yarn 262 is high and the basket hole 263 is small, as compared to the sheet fibrous body 251.
[Structure Example 3 of Sheet Fibrous Body]

Figure 8:
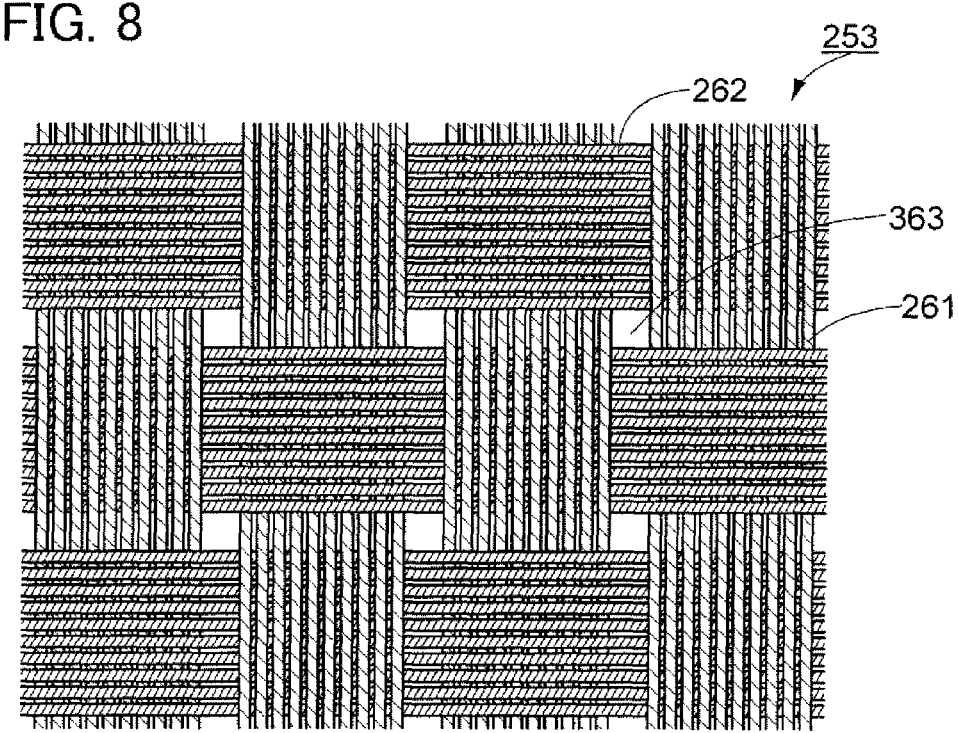
FIG. 8 is another example of a structure of a sheet fibrous body applied to a prepreg in FIG. 1D.

A woven fabric used for a sheet fibrous body is not limited to a plain-woven fabric. FIG. 8 illustrates an example of a structure of such a sheet fibrous body. FIG. 8 is a plan view of a sheet fibrous body 253. As illustrated in FIG. 8, the sheet fibrous body 253 is obtained by alternately weaving a bundle of ten warp yarns 261 and a bundle of ten weft yarns 262 so that the bundles intersect with each other.

Further, to protect an electronic device with the use of a cured prepreg more effectively, the area of the basket hole 263 of each of the sheet fibrous bodies (251, 252, and 253) is preferably smaller than the area of a portion of the electronic device, which is locally pressed when the electronic device is used. For example, in the case where the electronic device is pressed with a tool having a sharp tip, like a writing implement such as a pen or a pencil, the shape of the basket hole 263 is preferably a quadrangle having sides each of which has a length of from 0.01 mm to 0.2 mm.

This embodiment can be combined with any of the other embodiments as appropriate.

Embodiment 3

In this embodiment, as an example, a structure of an electronic device capable of transmitting and receiving data through wireless communication and a manufacturing method of the electronic device are described.

Figure 9:
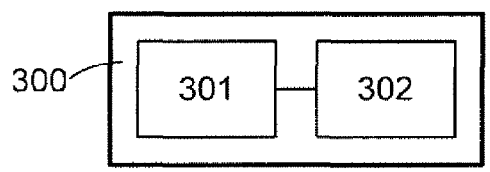
FIG. 9 is a block diagram illustrating a structural example of an electronic device, according to an embodiment of the present invention.

FIG. 9 is a block diagram illustrating an example of a structure of an electronic device 300 of this embodiment. As illustrated in FIG. 9, the electronic device 300 includes an antenna 301 and a functional circuit 302 which includes a plurality of electronic elements. The antenna 301 transmits and receives carrier waves. For the antenna 301, the one with a structure suitable for a frequency band in which communication is performed is selected. The functional circuit 302 has at least a function of processing carrier waves received by the antenna 301 and/or a function of generating carrier waves transmitted from the antenna 301.

Carrier waves are a signal of AC waves which is also referred to as a carrier. In wireless communication, the frequency or amplitude of carrier waves is changed (modulated) in accordance with a signal representing data to generate modulated waves, and the data is communicated through transmission and reception of the modulated waves. There are some kinds of methods for modulating carrier waves. A modulation method in which data is represented by the amplitude of carrier waves is called amplitude modulation. A modulation method in which data is represented by the frequency of carrier waves is called frequency modulation.

As a specific example of the electronic device 300, an IC chip (also referred to as a wireless chip) which can exchange data without contact can be given. In addition, a radio frequency identification (RFID) tag with which individual identification without contact is performed can also be given. The RFID tag is also referred to as an RF tag, a wireless tag, an electronic tag, or an IC tag.

Figure 10:
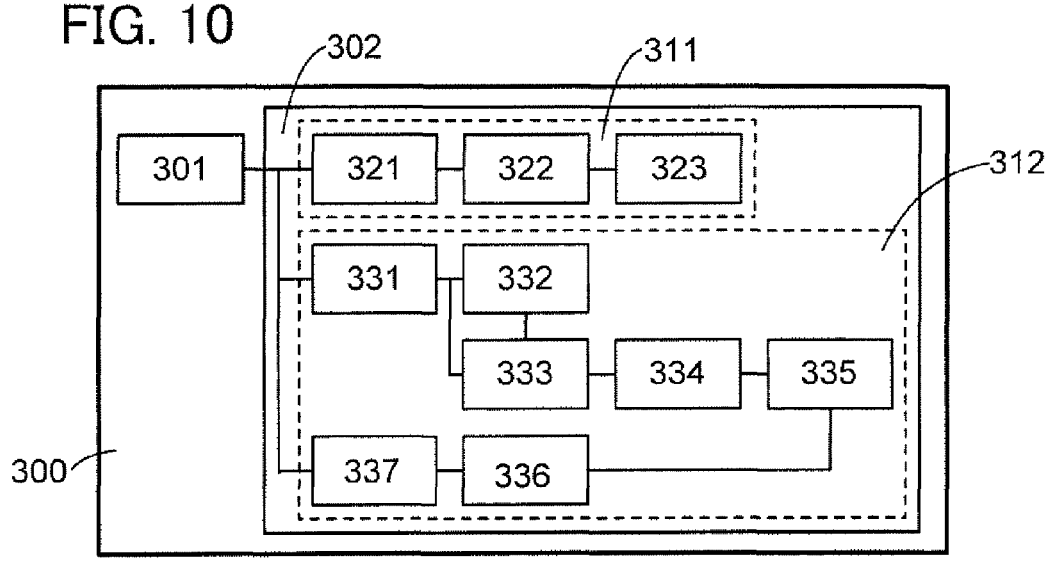
FIG. 10 is a block diagram illustrating a structural example of an electronic device, according to an embodiment of the present invention.
Figure 11:
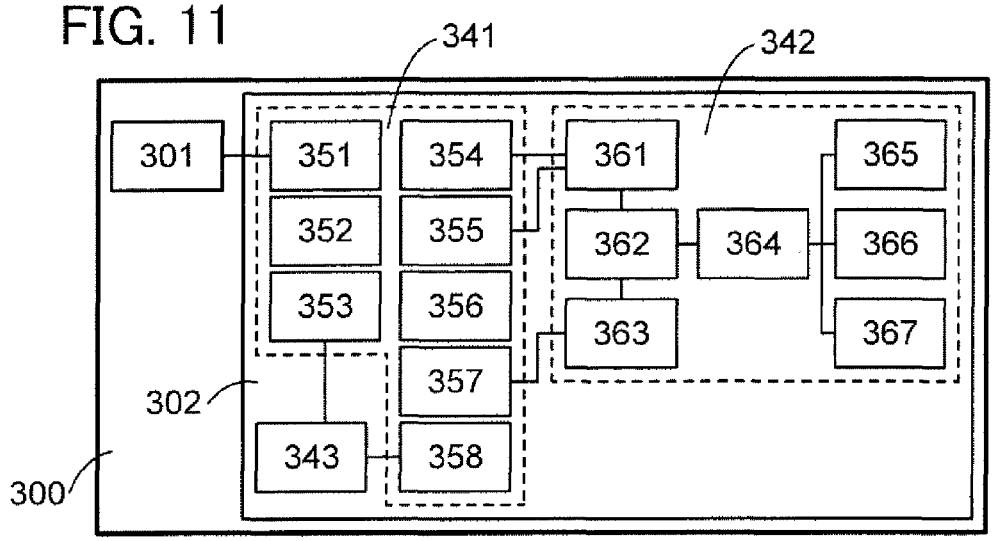
FIG. 11 is a block diagram illustrating a structural example of an electronic device, according to an embodiment of the present invention.

An example of a structure of the electronic device 300 which can be used for an IC chip or an RFID tag will be described with reference to FIG. 10 and FIG. 11. FIG. 10 is a block diagram illustrating an example of a structure of the electronic device 300 and FIG. 11 is a block diagram illustrating another example of a structure of the electronic device 300.

First, the structure of the electronic device 300 in FIG. 10 will be described. In the electronic device 300 in FIG. 10, the functional circuit 302 can be divided into a power source portion 311 and a logic circuit portion 312 in terms of functions.

The power source portion 311 is a device for supplying power to the electronic device 300 and includes, for example, a rectifier circuit 321, a power storage portion 322, and a constant voltage circuit 323. The rectifier circuit 321 is a circuit to generate a DC voltage from a signal (carrier waves) received by the antenna 301. The power storage portion 322 is a circuit to store the DC voltage generated by the rectifier circuit 321 and thus the rectifier circuit 321 includes, for example, a plurality of capacitors. The constant voltage circuit 323 is a circuit to make the voltage generated by the rectifier circuit 321 constant.

The logic circuit portion 312 has a function of extracting data from the signal (the carrier waves) received by the antenna 301, a function of generating carrier waves, which represent data and are transmitted from the antenna 301, and the like. For example, the logic circuit portion 312 includes a demodulation circuit 331, a clock generation/correction circuit 332, a code recognition/judgment circuit 333, a memory controller 334, a memory device 335, an encoding circuit 336, and a modulation circuit 337.

The demodulation circuit 331 is a circuit to demodulate the carrier waves received by the antenna 301. The clock generation/correction circuit 332 is a circuit to generate a clock signal based on the signal output from the demodulation circuit 331 and to correct the clock signal.

The code recognition/judgment circuit 333 recognizes a code included in the carrier waves received by the antenna 301 and makes a judgment. Further, the code recognition/judgment circuit 333 has a cyclic redundancy check (CRC) function, for discriminating a transmission error. As the code recognized by the code recognition/judgment circuit 333, an end-of-frame (EOF) signal, a start-of-frame (SOF) signal, a flag, a command code, a mask length, a mask value, or the like can be given.

The memory controller 334 generates, based on the code recognized by the code recognition/judgment circuit 333, a signal for reading out data from the memory device 335. The memory device 335 includes at least a read-only memory (ROM). As an example of the ROM, a mask ROM or a PROM can be given. Further, the memory device 335 may include a memory circuit such as a random access memory (RAM), which is capable of rewriting data. As the memory circuit capable of rewriting data, for example, a DRAM, an SRAM, an FeRAM, an EEPROM, or a flash memory can be used.

The encoding circuit 336 encodes data which is to be transmitted from the electronic device 300, such as data read out from the memory device 335, or the like. The modulation circuit 337 modulates the signal based on the data which has been encoded in the encode circuit 336 to generate carrier waves which can be transmitted from the antenna 301.

Next, the structure of the electronic device 300 in FIG. 11 will be described. The electronic device 300 functions as an arithmetic processing unit which operates through wireless communication with an external device. In the electronic device 300 in FIG. 11, the functional circuit 302 can be divided into an analog circuit portion 341, a digital circuit portion 342, and a power storage portion 343 in terms of functions.

The analog circuit portion 341 includes a resonance circuit 351 having a resonant capacitor, a constant voltage circuit 352, a rectifier circuit 353, a demodulation circuit 354, a modulation circuit 355, a reset circuit 356, an oscillator circuit 357, and a power supply control circuit 358.

The digital circuit portion 342 includes an RF interface 361, a control register 362, a clock controller 363, a central processing unit (CPU) 364, a CPU interface 365, an RAM 366, and an ROM 367.

The operation of the electronic device 300 in FIG. 11 is roughly described below. A signal (carrier waves) received by the antenna 301 is input to the analog circuit portion 341 and an induced electromotive force is generated in the resonance circuit 351. The induced electromotive force is stored in the power storage portion 343 via the rectifier circuit 353. The power storage portion 343 can be formed using a capacitor such as a ceramic capacitor or an electric double layer capacitor.

The reset circuit 356 generates a signal which resets and initializes the digital circuit portion 342. For example, the reset circuit 356 generates a signal which rises after increase in a power supply voltage with delay as a reset signal. The oscillator circuit 357 changes the frequency and the duty ratio of a clock signal in accordance with a control signal generated by the constant voltage circuit 352. The demodulation circuit 354 is a circuit which demodulates a received signal, and the modulation circuit 355 is a circuit which modulates a signal so that data to be transmitted is included in carrier waves.

For example, when a modulation method by which a signal is processed in the electronic device 300 is an amplitude shift keying (ASK) method, which is one of amplitude modulation methods, the demodulation circuit 354 is preferably formed using a low-pass filter. The demodulation circuit 354 binarizes the received signal based on variation in amplitude. On the other hand, the modulation circuit 355 changes the resonance point of the resonance circuit 351, thereby changing the amplitude of the signal.

The clock controller 363 generates a control signal for changing the frequency and the duty ratio of a clock signal in accordance with a power supply voltage or a current consumed in the CPU 364. The power supply voltage is monitored by the power supply control circuit 358.

The signal received by the antenna 301 is demodulated by the demodulation circuit 354. The demodulated signal is decomposed into a control command, data, and the like by the RF interface 361. The control command is stored in the control register 362. The control command includes an instruction to a circuit included in the digital circuit portion 342, such as an instruction for reading out data from the ROM 367, an instruction for writing data to the RAM 366, or an arithmetic instruction to the CPU 364.

The CPU 364 accesses the ROM 367, the RAM 366, and the control register 362 via the CPU interface 365. The CPU interface 365 generates an access signal which allows the CPU 364 to access any of the ROM 367, the RAM 366, and the control register 362 in accordance with an address requested by the CPU 364.

There are several arithmetic processing methods of the CPU 364, and a method in which processing is performed by software is one of the methods. In this method, for example, the ROM 367 stores an operating system (OS) and the CPU 364 reads out a program stored in the ROM 367 to execute. Another method is a method in which processing is conducted by a dedicated arithmetic circuit, that is, a method in which processing is conducted by hardware. Another method is a method in which hardware and software are used. In this method, part of arithmetic processing is conducted by a dedicated arithmetic circuit and the other part of the arithmetic processing is conducted by the CPU 364 with the use of a program.

Next, a method for manufacturing the electronic device 300 of this embodiment will be described below. This manufacturing method includes a step of separation of a substrate which is used for manufacturing an electronic element included in the functional circuit 302.

For example, in the manufacturing method described in Embodiment 1, a separation film (e.g., a film including silicon) is formed between the substrate 100 and the insulating film 101 serving as a base and removed by etching, so that the electronic device can be separated from the substrate 100. Alternatively, the electronic device may also be separated from the substrate 100 in such a manner that a separation film which includes metal as its main component is formed between the substrate 100 and the insulating film 101 serving as a base and physical force is applied to the separation film in order to cause separation along the separation film. An example of the manufacturing method of the electronic device 300, to which the latter method is applied, will be described below with reference to FIGS. 12A to 12D, FIGS. 13A to 13D, FIGS. 14A to 14C, FIGS. 15A and 15B, FIGS. 16A and 16B, FIG. 17, and FIGS. 18A to 18D.

First, as illustrated in FIG. 12A, a substrate for manufacturing an electronic element of the functional circuit 302 is prepared. Here, as the substrate, a glass substrate 400 is used. The functional circuit 302 is formed over a base insulating film 401 which is formed over the glass substrate 400. A separation film 402 is formed between the base insulating film 401 and the glass substrate 400 so that the functional circuit 302 is separated from the glass substrate 400 after the functional circuit 302 is manufactured.

Before the separation film 402 is formed, a base film 403 is formed on and in close contact with the glass substrate 400. The base film 403 is a base film of the separation film 402 and is formed in order to improve adhesion between the separation film 402 and the glass substrate 400. The base film 403 can be formed using an insulating film with a single-layer structure or a layered structure. As the insulating film used to form the base film 403, a silicon oxide film, a silicon oxynitride film, a silicon nitride oxide film, a silicon nitride film, a metal oxide film, or the like can be used. Here, a silicon oxynitride film with a thickness of 100 nm is formed by a PECVD method.

Next, the separation film 402 is formed in contact with the base film 403. Here, as the separation film 402, a tungsten film with a thickness of 50 nm is formed by a sputtering method.

In this manufacturing method, separation is caused priorly inside the separation film 402 and/or at the interface between the separation film 402 and the base insulating film 401 by applying mechanical force to the separation film 402 so that the functional circuit 302 is separated from the glass substrate 400. In order that such separation may be caused, the separation film 402 is formed using a tungsten film, a molybdenum film, an alloy film of tungsten and molybdenum, an oxide film of tungsten and/or molybdenum, an oxynitride film of tungsten and/or molybdenum, a nitride oxide film of tungsten and/or molybdenum, or a nitride film of tungsten and/or molybdenum, for example. Further, the separation film 402 can be formed using a stack of films selected from the above. These films can be formed by a sputtering method, a PECVD method, a droplet discharging method, or the like.

The separation film 402 may be formed in such a manner that a tungsten film, a molybdenum film, or an alloy film of tungsten and molybdenum is formed as a first layer and an oxide film, an oxynitride film, a nitride oxide film, or a nitride film of the first layer is formed as a second layer. Alternatively, the separation film 402 may be formed in such a manner that a tungsten film, a molybdenum film, or an alloy film of tungsten and molybdenum is formed over the base film 403 and the film is subjected to oxidation treatment. As the oxidation treatment, thermal oxidation treatment, plasma oxidation treatment with oxygen or $N_2O$ plasma, surface treatment with a solution having strong oxidizing power, such as ozone water, or the like can be used.

Next, the base insulating film 401 with a single-layer structure or a layered structure is formed in contact with the separation film 402. An insulating film which can endure later steps of manufacturing the electronic device 300 is selected as the base insulating film 401 and can be formed in a manner similar to that of the insulating film 101 in FIG. 1A. Here, the base insulating film 401 has a three-layer structure; a silicon oxynitride film with a thickness of 100 nm to 700 nm is formed as a first layer, a silicon nitride oxide film with a thickness of 20 nm to 100 nm is formed as a second layer, and a silicon oxynitride film with a thickness of 50 nm to 150 nm is formed as a third layer. These films are formed by a PECVD method.

Next, the functional circuit 302 is manufactured over the base insulating film 401. The plurality of functional circuits 302 is simultaneously manufactured over the glass substrate 400 in the same process. A process of manufacturing two functional circuits 302 each including an n-channel transistor and a p-channel transistor is illustrated in drawings.

As illustrated in FIG. 12B, a semiconductor film 405 is formed over the base insulating film 401 in order to manufacture the functional circuits 302. Here, a crystalline silicon film is formed as the semiconductor film 405. For example, the crystalline silicon film can be formed in such a manner that an amorphous silicon film with a thickness of 40 nm to 80 nm is formed by a PECVD method with a mixed gas of $H_2$ and $SiH_4$ and then the amorphous silicon film is crystallized by irradiation with a second harmonic of an Nd:$YVO_4$ laser (a fundamental wave of 1064 nm). Alternatively, the amorphous silicon film may be crystallized by thermal treatment in a heating furnace.

Next, a resist mask is formed over the semiconductor film 405 and the semiconductor film 405 is etched into a desired shape using the resist mask, so that semiconductor films 420 and semiconductor films 430 are formed over the base insulating film 401 as illustrated in FIG. 12C. The semiconductor films 420 are semiconductor layers of the n-channel transistors and the semiconductor films 430 are semiconductor layers of the p-channel transistors. After the resist mask used to etch the semiconductor film 405 is removed, if needed, an impurity element serving as a donor or an acceptor is added to the semiconductor films 420 and/or the semiconductor films 430 in order to control the threshold voltage of the transistors. Alternatively, the step of adding an impurity element may be performed before the semiconductor film 405 is etched and may be performed as necessary in a later step.

Next, as illustrated in FIG. 12C, an insulating film 406 is formed so as to cover the semiconductor films 420 and the semiconductor films 430. The insulating film 406 serves as a gate insulating film of each of the transistors. The insulating film 406 can be formed in a manner similar to that of the insulating film 102 in FIG. 1A. Here, a silicon oxynitride film with a thickness of 10 nm to 100 nm is formed by a PECVD method. Further, after an insulating film is formed by a PECVD method or the like, the insulating film may be subjected to nitriding treatment with microwave-excited high-density plasma.

Next, as illustrated in FIG. 12C, conductive films 441 and conductive films 442 are formed over the insulating film 406. The conductive films 441 form gate electrodes (or gate wirings) of the n-channel transistors and the conductive films 442 form gate electrodes (or gate wirings) of the p-channel transistors. Here, each of the conductive films 441 and 442 is formed to have a two-layer structure. First, a tantalum nitride film with a thickness of 20 nm to 50 nm is formed over the insulating film 406 by a sputtering method and then a tungsten film with a thickness of 100 nm to 300 nm is formed over the tantalum nitride film by a sputtering method. Next, a resist mask is formed over the tungsten film. The stacked film of the tantalum nitride film and the tungsten film is etched with the use of the resist mask, so that the conductive films 441 and 442 are formed.

Next, as illustrated in FIG. 12D, n-type low-concentration impurity regions 423 are formed in the semiconductor films 420 and p-type high-concentration impurity regions 432 are formed in the semiconductor films 430. The n-type low-concentration impurity regions 423 form high-resistance regions of the n-channel transistors and the p-type high-concentration impurity regions 432 function as source and drain regions of the p-channel transistors.

In order to form these regions, first, resist masks which cover the semiconductor films 430 are formed. An impurity element which imparts n-type conductivity is added to the semiconductor films 420 with the use of the conductive films 441 as masks, so that the n-type low-concentration impurity regions 423 are formed in the semiconductor films 420. Regions in the semiconductor films 420, where the impurity element is not added in this step, become channel formation regions 421. Then, after the resist masks which cover the semiconductor films 430 are removed, resist masks which cover the semiconductor films 420 are formed. An impurity element which imparts p-type conductivity is added to the semiconductor films 430 with the use of the conductive films 442 as masks, so that the p-type high-concentration impurity regions 432 are formed in the semiconductor films 430. Then, the resist masks are removed. Regions in the semiconductor films 430, where the impurity element is not added in the step of adding the impurity element, become channel formation regions 431.

As for the steps illustrated in FIG. 12D, the p-type high-concentration impurity regions 432 may be formed first and then the n-type low-concentration impurity regions 423 may be formed.

In this embodiment, phosphorus (P), arsenic (As), or the like can be used as the impurity element which imparts n-type conductivity, and boron (B), aluminum (Al), gallium (Ga), or the like can be used as the impurity element which imparts p-type conductivity.

Next, as illustrated in FIG. 13A, an insulating film 407 is formed so as to cover the insulating film 406, the conductive films 441, and the conductive films 442. The insulating film 407 can be formed in a manner similar to that of the insulating film 103 in FIG. 1A. Here, the insulating film 407 is formed to have a two-layer structure; a silicon oxide film with a thickness of 50 nm to 150 nm is formed as a first layer by a PECVD method, and a low temperature oxide (LTO) film with a thickness of 100 nm to 250 nm is formed as a second layer by a thermal CVD method which is performed at a process temperature of 200° C. to 500° C.

Next, the insulating film 407 and the insulating film 406 are subjected to etching. This etching step is performed by anisotropic etching mainly in a perpendicular direction. By such anisotropic etching, sidewalls formed using the insulating film 407 can be formed on side surfaces of the conductive films 441 and the conductive films 442 as illustrated in FIG. 13B. Further, regions of the insulating film 406, which are covered with the conductive films 441, the conductive films 442, or the insulating films 407, are left in this etching step and the other regions of the insulating film 406 are removed.

Next, as illustrated in FIG. 13C, n-type high-concentration impurity regions 422 serving as source and drain regions are formed in the semiconductor films 420. First, resist masks which cover the semiconductor films 430 are formed, and then an impurity element which imparts n-type conductivity is added to the semiconductor films 420. In this step of adding the impurity element, the conductive films 441 and the insulating films 407 serve as masks, the n-type high-concentration impurity regions 422 are formed in the semiconductor films 420 in a self-aligned manner, and the n-type low-concentration impurity regions 423 formed in the step illustrated in FIG. 12D are left in portions overlapping with the insulating films 407.

Next, an insulating film 408 is formed so as to cover the semiconductor films 420, the semiconductor films 430, the conductive films 441, and the conductive films 442. Then, conductive films 443 to 445 are formed over the insulating film 408.

The insulating film 408 can be formed in a manner similar to that of the insulating film 103 in FIG. 1A. Here, the insulating film 408 is formed to have a three-layer structure. First, as a first layer, a silicon oxynitride film with a thickness of 20 nm to 100 nm is formed by a PECVD method. After that, heat treatment is performed to activate the impurity elements added to the semiconductor films 420 and the semiconductor films 430. Then, as a second layer, a silicon nitride oxide film with a thickness of 100 nm to 300 nm is formed by a PECVD method, and as a third layer, a silicon oxynitride film with a thickness of 200 nm to 1 μm is formed by a PECVD method.

Next, in order that the conductive films 443 and the conductive films 444 are electrically connected to the n-type high-concentration impurity regions 422 and the p-type high-concentration impurity regions 432, respectively, the insulating film 408 is etched so that openings are formed. Then, a conductive film to be the conductive films 443 to 445 is formed over the insulating film 408. The conductive film can be formed in a manner similar to that of the conductive film 113 in FIG. 1A. Here, as the conductive film, a conductive film with three layers is formed by a sputtering method. A first layer is a titanium film with a thickness of 50 nm to 150 nm, a second layer is a pure aluminum film with a thickness of 200 nm to 400 nm, and a third layer is a titanium film which is the same as the first layer. Then, a resist mask is formed over the conductive film with a three-layer structure and the conductive film is etched using the resist mask, so that the conductive films 443 to 445 are formed.

The conductive films 443 are electrically connected to the n-type high-concentration impurity regions 422 and each of them functions as a source electrode, a source wiring, a drain electrode, or a drain wiring of the n-channel transistor. The conductive films 444 are electrically connected to the p-type high-concentration impurity regions 432 and each of them functions as a source electrode, a source wiring, a drain electrode, or a drain wiring of the p-channel transistor. Further, the conductive film 445 forms a portion in which the functional circuit 302 and the antenna 301 are electrically connected to each other.

Through the above steps, electronic elements (n-channel transistors 491 and p-channel transistors 492) of the functional circuits 302 are completed. Next, an example of steps of forming a connection terminal of the functional circuit 302 and the antenna 301 is described with reference to FIGS. 14A to 14C and FIGS. 15A and 15B.

Figure 14A:
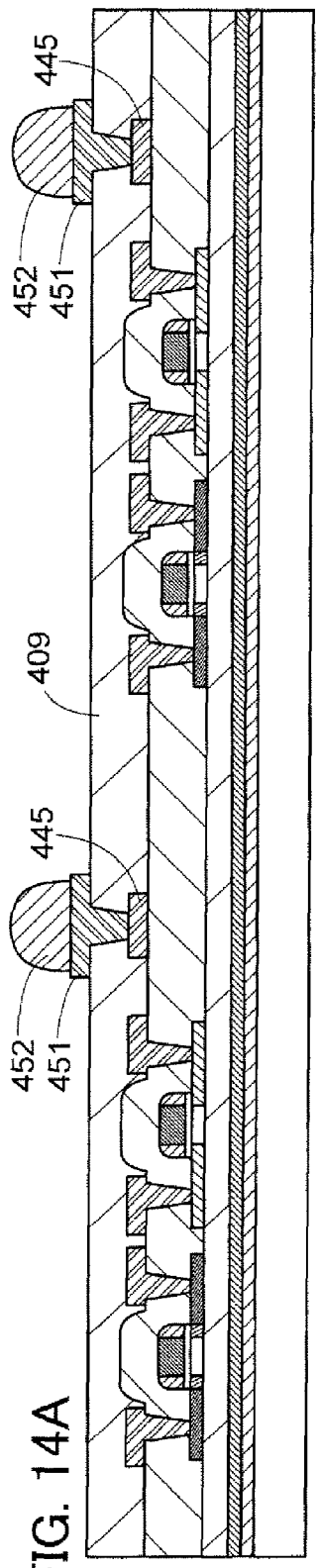
FIGS. 14A to 14C are cross-sectional views illustrating an example of steps following the step in FIG. 13D.

As illustrated in FIG. 14A, an insulating film 409 is formed so as to cover the conductive films 443 to 445. Here, the insulating film 409 is formed to have a two-layer structure. A dense insulating film is formed as a first layer in order to protect the electronic elements of the functional circuits 302. Here, a silicon nitride film with a thickness of 50 nm to 200 nm is formed as a first layer by a PECVD method. As a second layer, a resin film (e.g., a polyimide film) with a thickness of 1 μm to 3 μm is formed using a photosensitive resin material in order to flatten an upper surface of the functional circuits 302. Openings are formed in portions of the resin film, which correspond to the conductive films 445, by exposure treatment. Then, the silicon nitride film of the first layer is subjected to etching so that openings are formed in portions of the silicon nitride film, which overlap with the openings in the resin film.

Next, conductive films 451 which are electrically connected to the conductive films 445 are formed over the insulating film 409 and protrusions 452 are formed corresponding to the conductive films 451. Here, as the conductive films 451, a titanium film with a thickness of 100 nm to 300 nm is formed by a sputtering method.

The protrusions 452 can be formed in a manner similar to that of the protrusions 120 in FIG. 1C. Here, the conductive films 451 are coated with silver paste by a screen printing method. Then, the silver paste is baked, so that the protrusions 452 including silver are formed. The protrusions 452 protrude from the glass substrate 400 as compared to any portion. The protrusions 452 can also be referred to as conductors having projecting portions.

The conductive film 445, the conductive film 451, and the protrusion 452 form a terminal portion of the functional circuit 302. The terminal portion is a connection portion which is electrically connected to the antenna 301. Note that the protrusion 452 may be formed in close contact with the conductive film 445 without formation of the conductive film 451.

Next, a prepreg 460 formed using an uncured resin 462 including a reinforcing material 461 is prepared. The one which is similar to the prepreg 130 in FIG. 1D can be used as the prepreg 460. The prepreg 460 preferably has a thickness of 10 μm to 100 μm when it is cured. This is for protecting the functional circuit 302 and for giving flexibility to the functional circuit 302 with the cured prepreg 460. Further, in order that the protrusion 452 are formed so that the height of the protrusion 452 is half the thickness of the prepreg 460 or more and in order that the functional circuit 302 is made thin, the cured prepreg 460 preferably has a thickness of 10 μm to 30 μm.

Figure 14B:
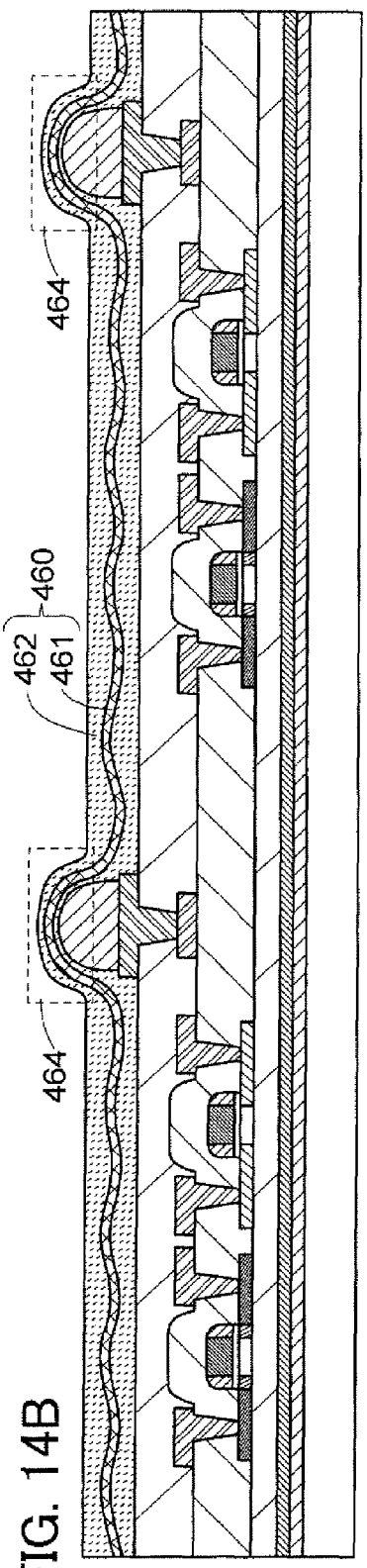

As illustrated in FIG. 14B, the uncured prepreg 460 is provided on an insulating film 409 side of the electronic device so as to be closely attached to the insulating film 409, the conductive films 451, and the protrusions 452. In the prepreg 460, the thicknesses of regions 464 which cover the protrusions 452 are smaller than those of the other regions.

Figure 14C:
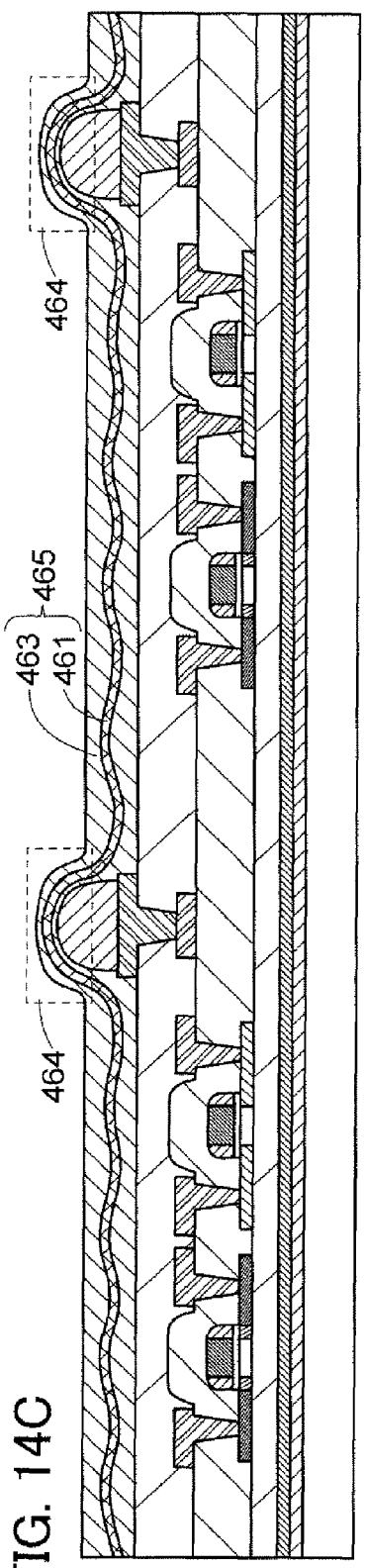

Then, the prepreg 460 is cured, so that an insulating film 465 including the reinforcing material 461 is formed as illustrated in FIG. 14C. In the insulating film 465, the resin 463 corresponds to the resin 462 which has been cured. That is, the insulating film 465 can also be referred to as a resin film including the reinforcing material 461. Further, the insulating film 465 functions as a sealing film of the functional circuits 302.

Here, a sheet fibrous body including a glass fiber is used for the reinforcing material 461 of the prepreg 460 and a thermosetting resin is used for a resin material of the resin 462 of the prepreg 460. The steps illustrated in FIGS. 14B and 14C are performed as a series of steps using a vacuum heat press. That is, the prepreg 460 is pressed against the glass substrate 400 by the vacuum heat press in a state where the prepreg 460 is stacked on the insulating film 409 side, and then the prepreg 460 is cured (solidified) to form the insulating film 465.

Figure 15A:
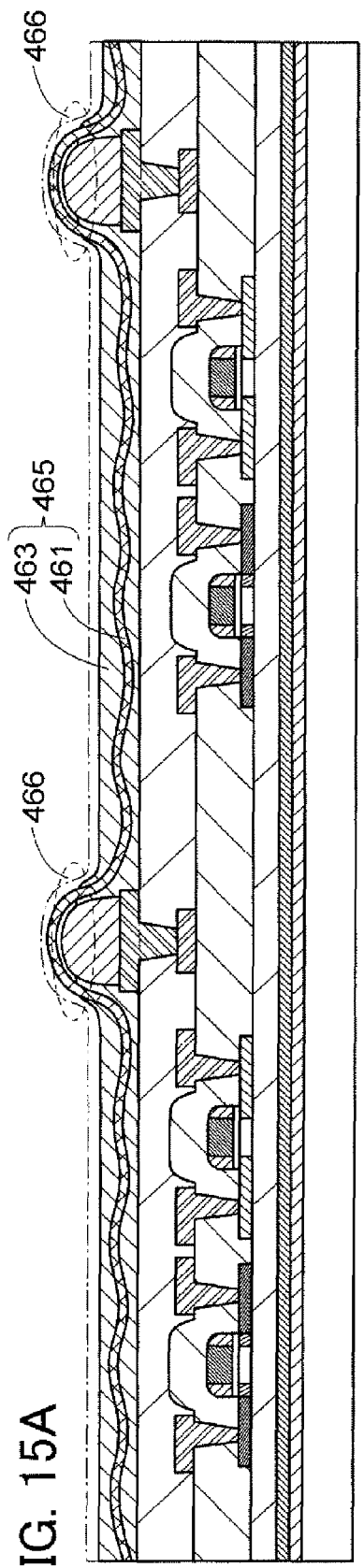
FIGS. 15A and 15B are cross-sectional views illustrating an example of steps following the step in FIG. 14C.

Next, the insulating film 465 is entirely reduced in thickness. In the regions 464, portions of the insulating film 465, which are in contact with the protrusions 452, have thicknesses smaller than those of portions in the other regions, so that openings 466 can be formed in the regions 464 as illustrated in FIG. 15A. In FIG. 15A, a dashed-dotted line indicates the insulating film 465 before the insulating film 465 is reduced in thickness. This step can be performed in a manner similar to the step of forming the openings 143 in FIG. 2C and is preferably performed by anisotropic etching. In this step, the resin 463 included in the insulating film 465 is removed but the reinforcing material 461 is not removed; accordingly, the reinforcing material 461 exists at each of the openings 466.

In this embodiment, a laser beam is not used for formation of the openings 466, whereby the functional circuit 302 is not damaged by a laser beam. Accordingly, miniaturization and high performance of the electronic elements of the functional circuit 302 are easily achieved. Thus, the functional circuit 302 including the CPU 364 illustrated in FIG. 11, which is a high performance circuit, can be manufactured with a high yield.

Figure 15B:
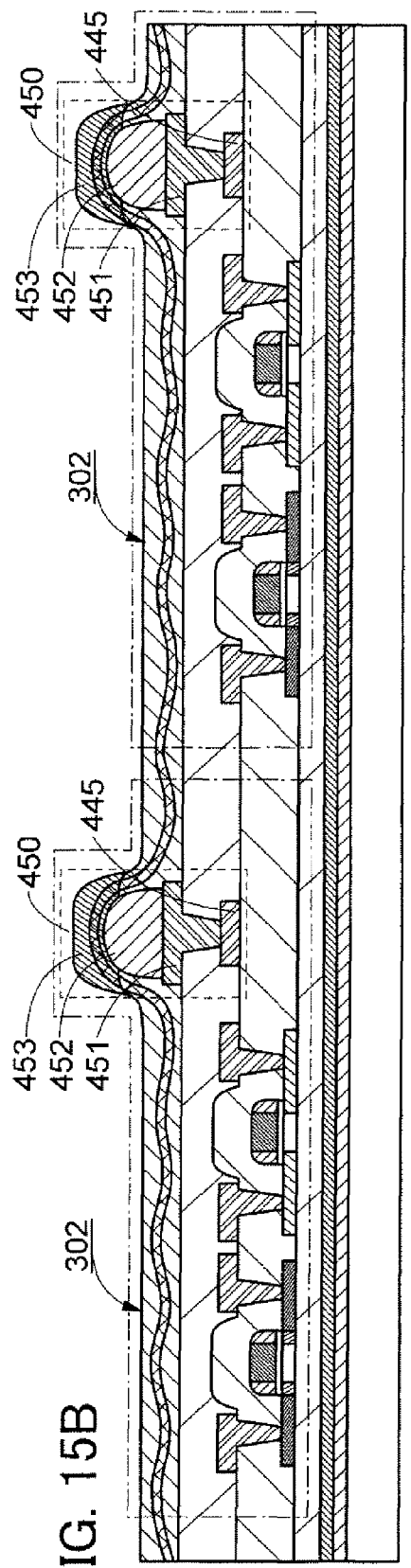

Next, as illustrated in FIG. 15B, at the openings 466, conductors 453 are formed in close contact with the protrusions 452. This step can be performed in a manner similar to the step of forming the conductors 121 in FIG. 3A. Here, the conductors 453 are formed using silver paste.

Through the above steps, the functional circuits 302 each provided with a terminal portion 450 are manufactured. The terminal portion 450 is a connection portion which is electrically connected to the antenna 301 and includes the conductive film 445, the conductive film 451, the protrusion 452, and the conductor 453. Next, a step of separating the functional circuits 302 from the glass substrate 400 is performed. This separation step can be performed as follows, for example.

Irradiation with a UV laser beam is performed from an insulating film 465 side so that a groove (not illustrated) is formed in a stack over the glass substrate 400 so as to reach the separation film 402. By formation of the groove, separation is caused inside the separation film 402 and/or at the interface between the base insulating film 401 and the separation film 402. Accordingly, the plurality of functional circuits 302 can be separated from the glass substrate 400 with relatively weak force (force that can be applied by a hand). Next, as illustrated in FIG. 16A, a heat separation-type adhesive film 470 (hereinafter referred to as the "film 470") which is formed using a resin film such as a polyethylene terephthalate (PET) film is attached to the insulating film 465. Then, as illustrated in FIG. 16A, the stack formed over the base insulating film 401 is separated from the glass substrate 400. This separation step can be performed using a separating apparatus provided with a winding roller. Alternatively, the separation step can be performed by a hand or by pulling of the film 470 with a pair of tweezers.

Next, in order to protect the base insulating film 401 which is exposed due to removal of the glass substrate 400, a protective film which is formed using a prepreg including a reinforcing material is formed. Further, for formation of the protective film, the one which is similar to the prepreg 460 used for forming the insulating film 465 can be used. The prepreg 460 which has not been cured is attached to the base insulating film 401, and the prepreg 460 is cured by a vacuum heat press in a state where the prepreg 460 is closely attached to the base insulating film 401. As a result, as illustrated in FIG. 16B, an insulating film 467 including a reinforcing material 461 is formed on the base insulating film 401 side. The insulating film 467 is a resin film including the reinforcing material 461 and functions as a sealing film of the functional circuits 302.

Figure 17:
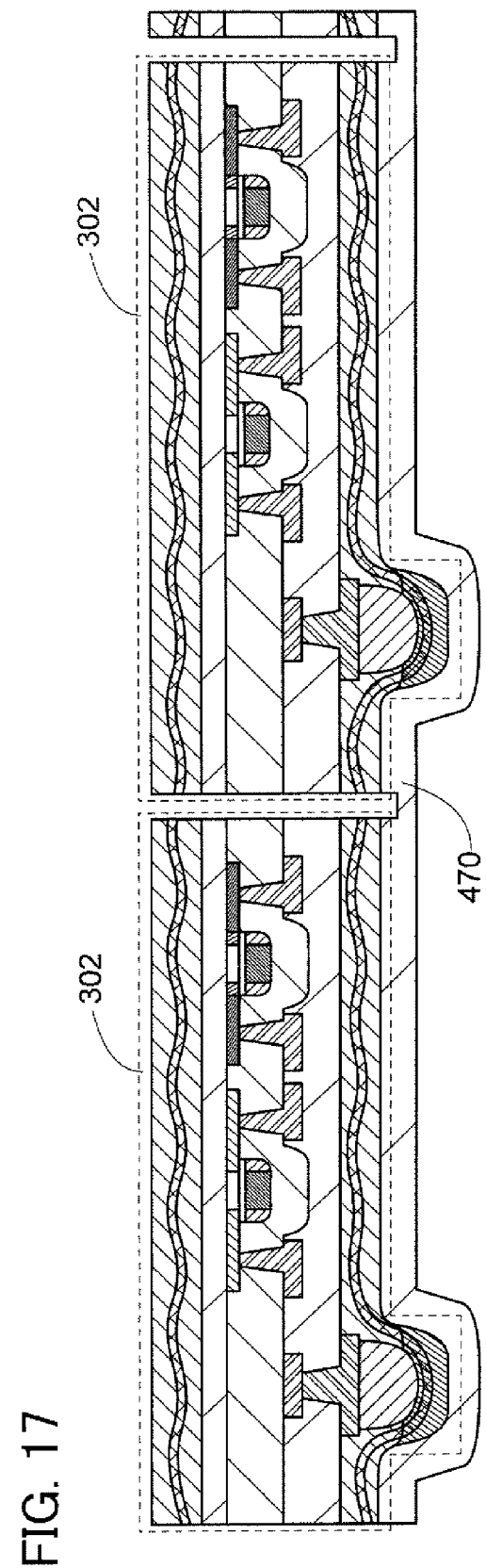
FIG. 17 is a cross-sectional view illustrating an example of a step following the step in FIG. 16B.

Next, the stack held by the film 470 is divided into the individual functional circuits 302. This step can be performed by treatment such as dicing or scribing. Here, scribing with the use of a UV laser beam is performed. Irradiation with a UV laser beam is performed from the insulating film 467 side, so that a groove is formed in the stack held by the film 470. As illustrated in FIG. 17, the groove is formed, whereby the plurality of functional circuits 302 held by the film 470 is formed. In order to separate the functional circuits 302 from the film 470, the film 470 may be heated so that adhesiveness of the film 470 is decreased.

Next, the antenna 301 is electrically connected to the functional circuit 302. Here, as the antenna 301, a film antenna including a film 500 formed using a resin such as polyester and a conductive film 501 formed over the film 500 is used. As the film 500, a film which has flexibility and is formed using an insulating material is preferably used. Since the functional circuit 302 has a structure in which the electronic elements are sealed with the insulating film 465 and the insulating film 467 each of which is formed using a resin, the functional circuit 302 is flexible and bendable. Therefore, when the antenna 301 is formed using a film antenna which is bendable, the electronic device 300 can also be flexible.

For example, as the film 500, a resin film such as a polyester film, a polycarbonate film, an acrylic film, or a polyimide film can be used. The conductive film 501 includes a portion forming a main body of the antenna and a terminal portion which is electrically connected to the functional circuit 302. A surface of the conductive film 501 is covered with a layer formed using an insulating material such as a resin, except for the terminal portion.

As illustrated in FIG. 18A, the conductive film 501 of the antenna 301 and the terminal portion 450 (the protrusion 452) of the functional circuit 302 are electrically connected to each other. Here, the conductive film 501 and the protrusion 452 are electrically connected to each other using a conductor 510 formed using a conductive paste. Needless to say, a means for connecting the conductive film 501 and the protrusion 452 is not limited to the conductive paste. The practitioner can select the means as appropriate in consideration of structures (e.g., shapes, materials, or manufacturing methods) of the conductive film 501 and the protrusion 452. For example, it is possible to form the conductor 510 using an anisotropic conductive film or a solder paste.

The conductive film 501 may have a suitable structure (e.g., a shape, a size) in accordance with the frequency band of carrier waves transmitted and received by the electronic device 300, the communication distance, or the like. Three examples of the structure of the antenna 301 (the conductive film 501) are described with reference to FIGS. 18B to 18D.

For example, when the frequency band is from the 125 kHz band to the 135 kHz band or the 13.56 MHz band, a loop antenna, a coil antenna, or a spiral antenna may be used as the antenna 301. FIG. 18B illustrates a plan view of the electronic device 300 in which a loop antenna is applied to the antenna 301. In addition, FIGS. 18C and 18D illustrate a structural example of the electronic device 300 used in the UHF band (860 MHz to 960 MHz band) and a structural example of the electronic device 300 used in the 2.45 GHz band, respectively. The antenna 301 of the electronic device 300 in FIG. 18C is a dipole antenna and the antenna 301 of the electronic device 300 in FIG. 18D is a patch antenna.

In addition, the electronic device 300 of this embodiment may be embedded in paper or interposed between two plastic substrates, whereby an IC card can be manufactured. Further, the electronic device 300 in FIG. 18A is embedded in paper, and bills, securities, bearer bonds, and certificates can be formed using the paper. The electronic device 300 is embedded, whereby the certificates and the like can each have an authentication function and an effect of preventing forgery can be obtained.

Further, the electronic device 300 may be used by being fixed to a variety of goods and objects. As a method for fixing the electronic device 300 to the goods and objects, there are methods such as embedding the electronic device 300 in the goods and objects and attaching the electronic device 300 to the surface of the goods and objects. Since the electronic device 300 of this embodiment has flexibility, the appearance of an object to which the electronic device 300 is attached is unlikely to be spoiled, and the electronic device 300 can be fixed to a curved surface. Further, as the goods and objects to which the electronic device 300 is fixed, for example, the following can be given: packaging containers (such as wrapping paper and bottles), recording media (such as Blu-ray Discs, DVDs, and USB memories), clothing and accessories (such as bags, glasses, and clothing), foods, plants, animals (such as livestock and pets), commodities, and shipping tags and labels on products and baggage. When the electronic device 300 is fixed to these goods and objects, inspection, distribution management, historical management of the objects, and the like are easily systematized.

For example, when the electronic device 300 is fixed to a shipping tag or a price tag of a product and information stored in the electronic device 300 is read with a reader/writer which is provided beside a conveyor belt, data on a manufacturing process, a distribution process, a delivery destination, and the like is obtained and thus product inspection and stock management can be performed with high efficiency.

Note that this embodiment can be combined with any of the other embodiments as appropriate.

Embodiment 4

In the method for manufacturing the electronic device 300, according to Embodiment 3, the step of forming the openings 466 in the insulating film 465 covering the protrusions 452 is performed and then the step of separating the glass substrate 400 from the functional circuits 302 is performed (see FIGS. 15A and 15B). In this embodiment, an example of a method for manufacturing the electronic device 300, in which these steps are performed in the reverse order, will be described. Description will be given with reference to FIGS. 19A and 19B, FIGS. 20A and 20B, and FIGS. 21A and 21B.

First, the steps up to and including the step in FIG. 14C are performed. Next, as illustrated in FIG. 19A, a heat separation-type adhesive film 471 is attached to the insulating film 465. Then, a stack formed over the base insulating film 401 is separated from the glass substrate 400. This step can be performed in a manner similar to that of the step in FIG. 15B. After that, the insulating film 467 for protecting the base insulating film 401 is formed as illustrated in FIG. 19B. This step can be performed in a manner similar to that of the step in FIG. 16B.

Figure 20A:
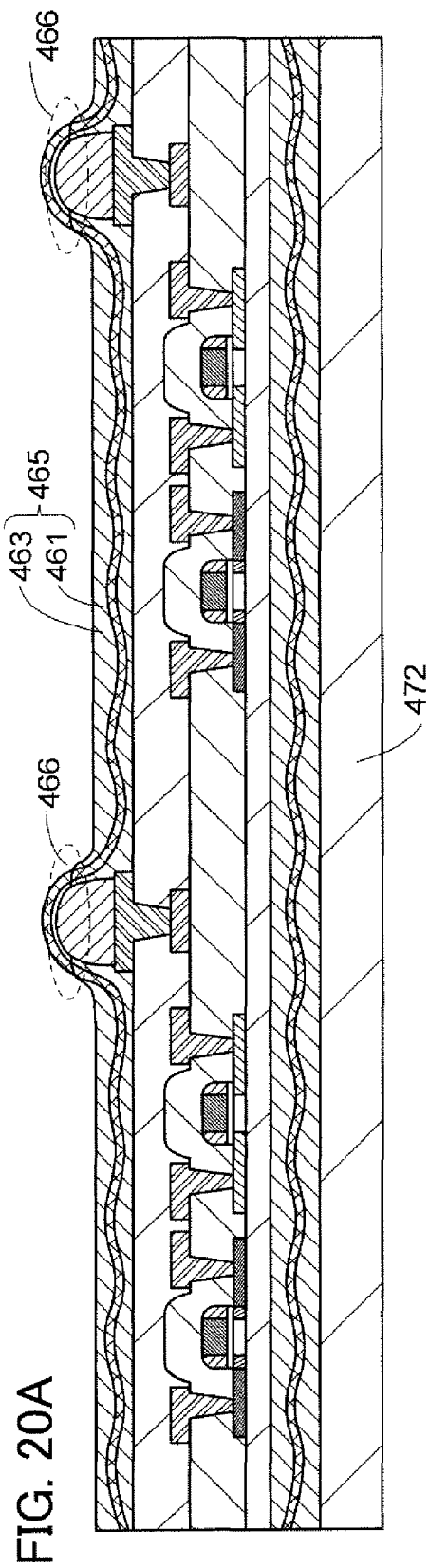
FIGS. 20A and 20B are cross-sectional views illustrating an example of steps following the step in FIG. 19B.

Next, the heat separation-type adhesive film 471 is heated to be separated. Further, another heat separation-type adhesive film 472 (hereinafter referred to as a "film 472") is attached to the insulating film 467. As illustrated in FIG. 20A, the openings 466 are formed in the regions 464 in such a manner that the thickness of the entire insulating film 465 is reduced. This step can be performed similarly to the step in FIG. 15A.

Next, the stack held by the film 472 is cut into individual functional circuits 302. This step can be performed by treatment such as dicing or scribing, like the step in FIG. 17A. Here, scribing is performed using a laser beam. UV laser beam irradiation is performed from the insulating film 465 side, whereby a groove is formed in the stack held by the film 472. Accordingly, as illustrated in FIG. 20A, the plurality of functional circuits 302 held by the film 472 are formed.

Then, the film 472 is heated so that the functional circuit 302 is separated from the film 472, an antenna 301 is electrically connected to the functional circuit 302, and thus, the electronic device 300 is completed (see FIG. 21B). The connection with the antenna 301 can be performed like the step in FIG. 18A.

Figure 20B:
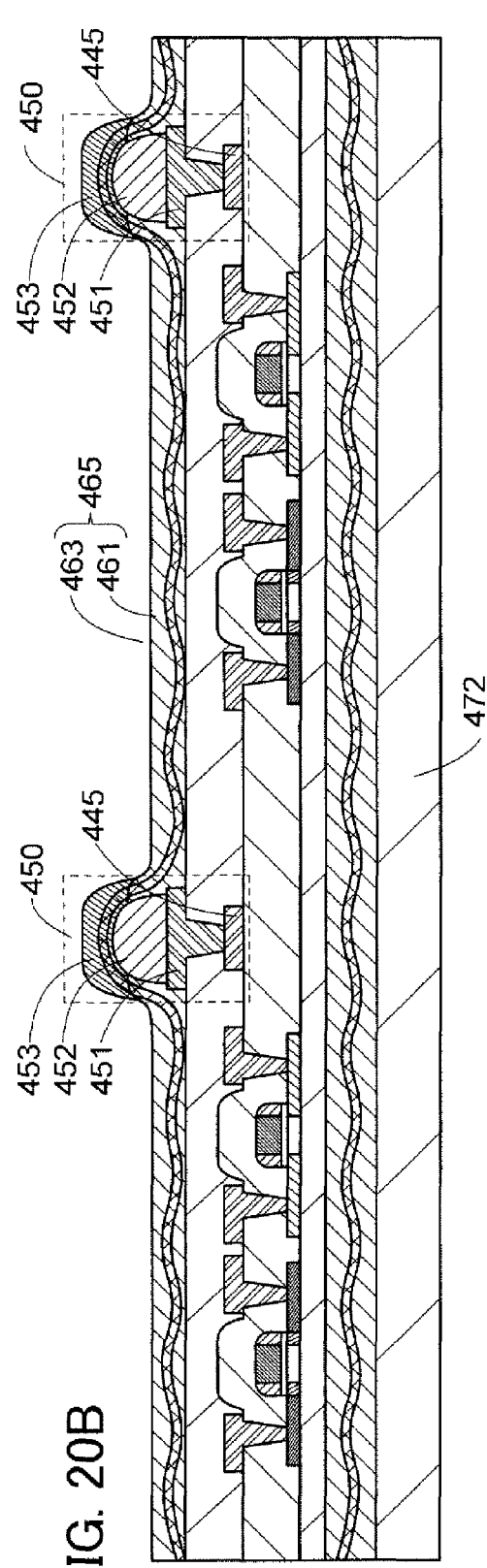

Note that in the step in FIG. 20B, a substrate formed using a rigid body, such as a glass substrate or a quartz substrate, may be used as a support substrate instead of the film 472. The electronic device 300 can be completed in the following manner: after formation of the opening 466, the support substrate is separated from the functional circuit 302, a heat separation-type adhesive film is attached to the insulating film 465 side or the insulating film 467 side, and the steps in FIGS. 21A and 21B are performed.

Note that this embodiment can be combined with any of the other embodiments as appropriate.

This application is based on Japanese Patent Application serial no. 2009-185092 filed with Japan Patent Office on Aug. 7, 2009, the entire contents of which are hereby incorporated by reference.

What is claimed is:

1. A terminal structure comprising:
a first conductor;
a resin film including a reinforcing member and covering the first conductor;
an opening formed in a region of the resin film, wherein the opening overlaps with the first conductor and is provided with the reinforcing member; and
a second conductor in contact with the first conductor in the opening.

2. The terminal structure according to claim 1, wherein another conductor which is attached to the second conductor in the opening is provided.

3. The terminal structure according to claim 1, wherein the reinforcing member is a sheet fibrous body.

4. The terminal structure according to claim 1, wherein a region of the resin film which is attached to the first conductor is thinner than another region of the resin film.

5. A terminal structure comprising:
a first conductor;
a resin film which does not include a reinforcing member and covers the first conductor;
an opening formed in a region of the resin film, wherein the opening overlaps with the first conductor; and
a second conductor in contact with the first conductor in the opening.

6. The terminal structure according to claim 5, wherein a region of the resin film which is attached to the first conductor is thinner than another region of the resin film.

7. An electronic device comprising:
an electronic element;
an insulating film over the electronic element;
a conductor formed over the insulating film and electrically connected to the electronic element;
a resin film over the insulating film and the conductor;
a reinforcing member in the resin film; and
an opening formed in a region of the resin film, which overlaps with the conductor and is provided with the reinforcing member.

8. The electronic device according to claim 7, wherein the reinforcing member is a sheet fibrous body.

9. An electronic device comprising:
an electronic element;
an insulating film over the electronic element;
a first conductor formed over the insulating film and electrically connected to the electronic element;
a resin film over the insulating film and the first conductor;
a sheet fibrous body in the resin film, the sheet fibrous body comprising a basket hole;
an opening formed in a region of the resin film, which overlaps with the first conductor; and
a second conductor formed over the resin film,
wherein the first conductor and the second conductor are electrically connected to each other in the opening through the basket hole of the sheet fibrous body.

10. The electronic device according to claim 9, wherein a region of the resin film which is attached to the first conductor is thinner than another region of the resin film.

11. An electronic device comprising:
a circuit including an electronic element formed over a first insulating film;
a second insulating film covering the electronic element;
a first conductor formed over the second insulating film and electrically connected to the electronic element;
a first resin film including a first reinforcing member and covering the second insulating film and the first conductor;

an opening formed in a region of the first resin film, which overlaps with the first conductor and is provided with the first reinforcing member;
a second conductor in contact with the first conductor at the opening; and
a second resin film including a second reinforcing member and covering the first insulating film of the electronic element.

12. The electronic device according to claim 11, wherein an antenna electrically connected to the second conductor is included.

13. The electronic device according to claim 11, wherein the first reinforcing member and the second reinforcing member are sheet fibrous bodies.

14. An electronic device comprising:
a circuit including an electronic element formed over a first insulating film;
a second insulating film covering the electronic element;
a first conductor formed over the second insulating film and electrically connected to the electronic element;
a first resin film which does not include a reinforcing member and covers the second insulating film and the first conductor;
an opening formed in a region of the first resin film, which overlaps with the first conductor;
a second conductor in contact with the first conductor at the opening; and
a second resin film including a reinforcing member and covering the first insulating film of the electronic element.

15. An electronic device comprising:
a circuit including an electronic element formed over a first insulating film;
a second insulating film covering the electronic element;
a first conductor formed over the second insulating film and electrically connected to the electronic element;
a first resin film including a reinforcing member and covering the second insulating film and the first conductor;
an opening formed in a region of the first resin film, which overlaps with the first conductor and is provided with the reinforcing member;
a second conductor in contact with the first conductor at the opening; and
a second resin film which does not include a reinforcing member and covers the first insulating film of the electronic element.

* * * * *